United States Patent
Chen

(10) Patent No.: US 9,685,947 B2
(45) Date of Patent: Jun. 20, 2017

(54) SIMPLIFIED GATE DRIVER FOR POWER TRANSISTORS

(71) Applicant: HALLIBURTON ENERGY SERVICES, INC., Houston, TX (US)

(72) Inventor: Zheng Chen, Kingwood, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 15/109,695

(22) PCT Filed: Mar. 30, 2015

(86) PCT No.: PCT/US2015/023281
§ 371 (c)(1),
(2) Date: Jul. 5, 2016

(87) PCT Pub. No.: WO2016/159950
PCT Pub. Date: Oct. 6, 2016

(65) Prior Publication Data
US 2017/0047926 A1 Feb. 16, 2017

(51) Int. Cl.
*H03B 1/00* (2006.01)
*H03K 3/00* (2006.01)
(Continued)

(52) U.S. Cl.
CPC ............ *H03K 17/691* (2013.01); *H03K 7/08* (2013.01); *H03K 17/145* (2013.01); *H03K 17/74* (2013.01); *H02M 1/08* (2013.01)

(58) Field of Classification Search
USPC .................................................. 327/108–112
See application file for complete search history.

(56) References Cited

U.S. PATENT DOCUMENTS 3,414,766 A * 12/1968 Miller ..................... G05F 1/445
315/194
4,767,978 A 8/1988 Reid et al.
(Continued)

FOREIGN PATENT DOCUMENTS

CN  101677240  3/2010
WO  0167587    9/2001
(Continued)

OTHER PUBLICATIONS

Bourgeois, Pulse Controlled Inverter, ST Microelectronics, Application Note AN-522, available online at http://application-notes.digchip.com/005/5-10421.pdf, 1999, 6 pages.
(Continued)

*Primary Examiner* — Adam Houston
(74) *Attorney, Agent, or Firm* — Kilpatrick Townsend & Stockton LLP

(57) ABSTRACT

A pulse-transformer-based isolated gate driver circuit uses a small count of high-temperature-qualified components to drive a power semiconductor switch with asymmetrical voltage biases. A differential driver generates a pulse signal from a pulse-width-modulated signal, which is passed to a charge and lock circuit through a transformer. The charge and lock circuit includes an activation path and a deactivation path, which are selectively open to current flow based on positive or negative voltage pulses in the pulse signal, to selectively turn the main semiconductor switch on or off. The charge and lock circuit can lock voltage across the main semiconductor switch to keep the main semiconductor switch in an "on" or and "off" state.

20 Claims, 15 Drawing Sheets

(51) Int. Cl.
*H03K 17/691* (2006.01)
*H03K 17/14* (2006.01)
*H03K 7/08* (2006.01)
*H03K 17/74* (2006.01)
*H02M 1/08* (2006.01)

(56) References Cited

U.S. PATENT DOCUMENTS

| | | |
|---|---|---|
| 5,124,595 A | 6/1992 | Mandelcorn et al. |
| 5,481,219 A | 1/1996 | Jacobs et al. |
| 5,550,412 A | 8/1996 | Anneser et al. |
| 5,625,265 A * | 4/1997 | Vlahu .................. H02P 6/08 318/400.27 |
| 5,781,040 A * | 7/1998 | Myers .................. H03K 17/691 327/109 |
| 5,786,687 A | 7/1998 | Faulk et al. |
| 5,910,746 A | 6/1999 | Fordyce et al. |
| 6,180,959 B1 | 1/2001 | Iwasaki et al. |
| 6,456,511 B1 * | 9/2002 | Wong .................. H02M 1/36 363/21.13 |
| 6,836,161 B2 | 12/2004 | Akiyama et al. |
| 6,970,023 B2 | 11/2005 | Fedigan et al. |
| 7,102,898 B2 | 9/2006 | Brkovic et al. |
| 7,582,939 B2 | 9/2009 | Bakran et al. |
| 7,679,941 B2 | 3/2010 | Raju et al. |
| 7,965,522 B1 | 6/2011 | Hornberger et al. |
| 8,325,497 B2 | 12/2012 | Marotta et al. |
| 8,582,334 B2 | 11/2013 | Hayashi et al. |
| 8,643,407 B2 | 2/2014 | Reese et al. |
| 8,816,666 B2 | 8/2014 | Kimura |
| 2010/0026208 A1 * | 2/2010 | Shteynberg ........ H05B 33/0815 315/297 |
| 2012/0063184 A1 | 3/2012 | Mazumder et al. |
| 2012/0206171 A1 | 8/2012 | Kimura et al. |
| 2013/0057412 A1 | 3/2013 | Gard et al. |
| 2013/0063184 A1 | 3/2013 | Liang et al. |
| 2013/0271187 A1 | 10/2013 | Hayashi et al. |
| 2014/0049295 A1 | 2/2014 | Gan et al. |
| 2014/0049297 A1 | 2/2014 | Nagai et al. |
| 2014/0265900 A1 * | 9/2014 | Sadwick ............ H05B 33/0803 315/200 R |
| 2014/0328139 A1 * | 11/2014 | Minto .................. G01V 1/02 367/25 |
| 2016/0057843 A1 * | 2/2016 | Pickett ................ H05B 41/282 315/200 R |
| 2016/0211841 A1 * | 7/2016 | Harrison ............... H02M 1/44 |
| 2017/0019095 A1 * | 1/2017 | Leong .................. H03K 17/167 |
| 2017/0040994 A1 * | 2/2017 | Chen .................... H03K 17/691 |
| 2017/0047926 A1 * | 2/2017 | Chen .................... H03K 7/08 |

FOREIGN PATENT DOCUMENTS

| | | |
|---|---|---|
| WO | 2014120847 | 8/2014 |
| WO | 2016159948 | 10/2016 |

OTHER PUBLICATIONS

Hasanuzzaman, MOSFET Modeling, Simulation and Parameter Extraction in 4H- and 6H-Silicon Carbide, published 2005, p. 99.

International Rectifier, Transformer-Isolated Gate Driver Provides very large duty cycle ratios, International Rectifier, Application Note AN-950, available online at www.irf.com/technical-info/appnotes/an-950.pdf, 6 pages.

Nguyen et al., Compact, isolated and simple to implement gate driver using high frequency transformer, Proceedings of IEEE Applied Power Electronics conf., 2008, pp. 1092-1098.

International Patent Application No. PCT/US2015/023281, International Search Report and Written Opinion, mailed Dec. 30, 2015, 10 pages.

Waffler et al., High Temperature (>200° C.) Isolated Gate Drive Topologies for Silicon Carbide (SiC) JFET, Proceedings of IEEE Industrial Electronics Conf., 2008, pp. 2867-2872.

Wang et al., Transformer-isolated gate drive design for SiC JFET phase-leg module, Proceedings of IEEE Energy Conversion Congress and Expo., Sep. 17-22, 2011, pp. 1728-1733.

* cited by examiner

SIMPLIFIED GATE DRIVER FOR POWER TRANSISTORS

CROSS-REFERENCE TO RELATED APPLICATIONS

This is a U.S. national phase under 35 U.S.C. 371 of International Patent Application No. PCT/US2015/023281, titled "Simplified Gate Driver for Power Transistors" and filed Mar. 30, 2015, the entirety of which is incorporated herein by reference.

TECHNICAL FIELD

The present disclosure relates to drivers for transistors, such as metal-oxide-semiconductor field-effect transistors (MOSFETs), generally and more specifically to drivers designed for high-temperature environments, such as down a wellbore.

BACKGROUND

Transistors, such as field-effect transistors, are electrical building blocks used across many fields. Some transistors can act as main semiconductor switches, allowing current to pass through them when in an "on" or "closed" state or allowing them to inhibit current passing through them when in an "off" or "open" state. Placing a main semiconductor switch in an "on" or an "off" state can require the semiconductor switch being driven, such as by providing a certain voltage across the gate and source contacts of the main semiconductor switch. To operate properly, certain main semiconductor switches, such as MOSFETs, are driven using driver circuitry (e.g., a gate driver). Challenges in designing gate driver circuitry can occur, such as because of the particular semiconductor that needs to be driven or because of the environment in which the gate driver will operate.

New types of transistors, such as Silicon-Carbide (SiC) MOSFETs can provide advantages over existing Silicon (Si) MOSFETs, but also may require different driving strategies. For example, many Si MOSFETS may be driven with symmetrical voltage biases, where the positive and negative voltages are provided at the same magnitude (e.g., ±10 Volt (V)), but SiC MOSFETs may be driven with asymmetrical voltage biases, where the positive and negative voltages are provided at different magnitudes (e.g., +25 V and −10 V). Many driver circuits are incapable of providing asymmetrical voltage biases, especially in compact, high-temperature-capable packages.

Additionally, in certain environments, gate drivers are isolated. For example, galvanically isolated gate drivers may be used to drive power semiconductor switches in power processing circuits, such as power converters, power transmitters, and other such circuits. The isolation is necessary because the power switch usually does not share the same ground as the gate control circuit, such as the high-side switches in an H-bridge topology. Some isolated gate drivers include a floating power supply to provide the necessary power across its isolation barrier to drive the gate of the power switch, and an isolated signal transmission circuit to send the low-power control signal to the gate of the power switch. Such gate drivers may be bulky and complicated, especially when created for high-temperature environments (e.g., environments with a temperature above 125° C.) because of the limited choices of integrated and temperature-qualified components.

In wellbore operations, drivers for semiconductor-based circuits may be subjected to harsh environments by, for example, being used in tools that are placed within a wellbore. Drivers may need to withstand high temperatures (e.g., above 125° C.). Additionally, available space may be severely limited, necessitating drivers that are small in size or use fewer components. Finally, due to the very high costs involved in retrieving tools that have been positioned within a wellbore, drivers may need to be reliable, especially at the high temperatures described above. Other requirements may exist that further disqualify the use of existing gate driver circuits.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
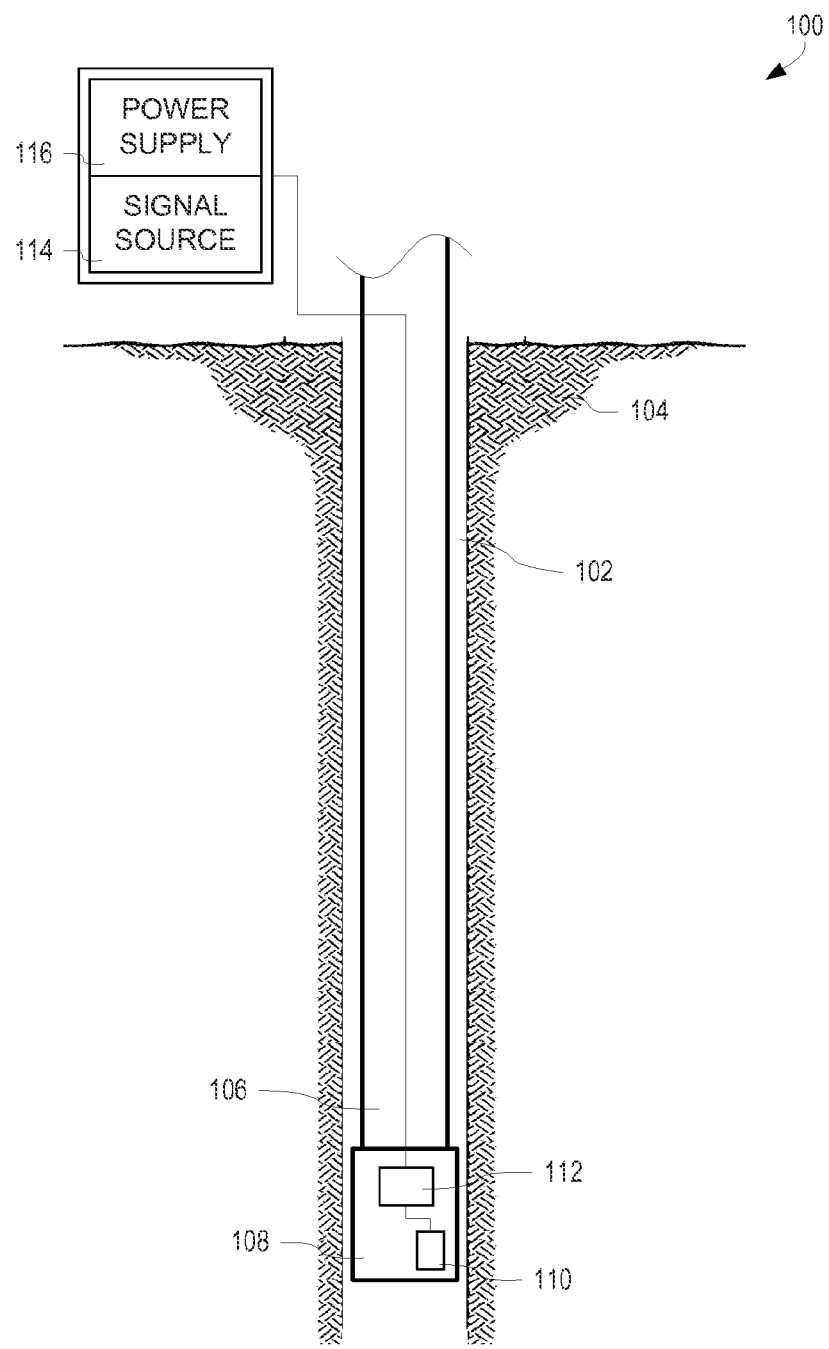
FIG. 1 is a schematic diagram of a wellbore servicing system that includes a tool having a main semiconductor switch driven by a gate driver according to certain aspects of the disclosure.

Certain aspects and features of the present disclosure relate to a pulse-transformer-based isolated gate driver circuit using a small count of high-temperature-qualified components to drive a power semiconductor switch (e.g., a MOSFET) with asymmetrical voltage biases. The gate driver can include a differential driver circuit that generates a pulse signal from a pulse-width-modulated signal, which is then passed to a charge and lock circuit through a transformer. The pulse signal can include positive, neutral, and negative voltage pulses that can be used by the charge and lock circuit to turn a main semiconductor switch on or off. The charge and lock circuit can include an activation path and a deactivation path, which are selectively open to current flow based on whether the pulse signal includes a positive or negative voltage pulse, to selectively turn the main semiconductor switch on or off. During a neutral voltage pulse, the charge and lock circuit can lock the voltage across the main semiconductor switch to keep the main semiconductor switch in either an "on" state or an "off" state. During negative voltage pulses, the deactivation path provides a negative voltage across the main semiconductor switch that is smaller in magnitude than the positive voltage applied across the main semiconductor switch by the activation path during the positive voltage pulses. The term magnitude is used herein to describe the absolute value of the voltage, irrespective of a voltage's polarity.

The pulse transformer can have a primary winding (e.g., primary coil), to which the pulse signal is supplied, and one or more secondary windings (e.g., secondary coil), through which the pulse signal is provided to the charge and lock circuit. The pulse transformer provides signals to open and close alternate ones of a pair of transistor switches located in the activation path and deactivation path. The transistor switches can be field-effect transistors (FETs). The power to operate the charge and lock circuit, including power necessary to open and close the main semiconductor switch, is provided in the pulse signal, eliminating the need for a separate floating power supply. The pair of transistor switches allow current to flow through either the activation path to turn on the main semiconductor switch or the deactivation path to turn off the main semiconductor switch. The transformer can provide a turn-on transient (e.g., a positive voltage pulse), a turn-off transient (e.g. a negative voltage pulse), and a steady state (e.g., no change in voltage across the primary winding, or a neutral voltage pulse). A "neutral voltage pulse" can be the time of steady voltage between a positive voltage pulse and a negative voltage pulse or between a negative voltage pulse and a positive voltage pulse. During the turn-on and turn-off transients, the driver circuit can turn on and off the main semiconductor switch, respectively. During the steady state, each of the pair of transistor switches may be closed (e.g., off) and the use of diodes can keep the main semiconductor switch in either an "on" or "off" state for a period of time. During the steady state, one or the other of the pair of FETs can act as a capacitor to help maintain the voltage across the gate and source of the main semiconductor switch. Maintaining the voltage across the gate and the source may reduce power leakage and increase the amount of time that the main semiconductor switch can remain in an "on" or "off" state without sending power through the transformer.

A voltage across the main semiconductor switch can be a voltage applied to the main semiconductor switch across the gate and source of the main semiconductor switch. The main semiconductor switch can be an n-channel MOSFET operating in enhancement mode. The main semiconductor switch can be a power MOSFET. The main semiconductor switch can be a MOSFET operating in enhancement mode or depletion mode. The main semiconductor can be a p-channel MOSFET. The main semiconductor switch can be a junction gate field-effect transistor (JFET) or an insulated-gate bipolar transistor (IGBT). The main semiconductor switch can be selected to sustain a blocking voltage of 120 or 1200 volts. The main semiconductor switch can be selected to sustain a blocking voltage of any amount between 120 and 1200 volts. The main semiconductor switch can be selected to sustain a blocking voltage above 1200 volts or below 120 volts. The main semiconductor switch can be any suitable power transistor or power semiconductor device.

In one example, a Zener diode is used to provide the asymmetrical voltage bias. During a turn-on transient, the pulse transformer can provide a positive voltage pulse that will induce a positive voltage in the secondary winding that causes the second transformer switch to open, thus opening the activation path from the secondary winding, through a first diode, across the main semiconductor switch, through the second transformer switch, and back to the secondary winding. During a turn-off transient, the pulse transformer can provide a negative voltage pulse that may induce a negative voltage in the secondary winding that causes the first transformer switch to open. Causing the first transformer switch to open may open a deactivation path from the secondary winding, through a second diode, through the main semiconductor switch, through the first transformer switch, and back to the secondary winding. The Zener diode can be present on the deactivation path, such as between the main semiconductor switch and the first transformer switch, providing a clamping voltage to be overcome for the current to flow through the deactivation path during the negative voltage pulse. The negative voltage bias being applied across the main semiconductor switch during the turn-off transient has a smaller magnitude than the magnitude of the positive voltage bias applied across the main semiconductor switch during the turn-on transient. The clamping voltage of the Zener diode can be adjusted to provide the desired asymmetrical voltage bias. In a steady state after a turn-on transient (e.g., when a positive charge exists on the gate of the main semiconductor switch), the first transistor switch, which is off, can behave like a capacitor, being initially charged by the voltage across the main semiconductor switch, to keep the main semiconductor switch from discharging and turning off. Additionally, the first diode prevents discharging through the activation path. In a steady state after a turn-off transient (e.g., when a negative charge exists on the gate of the main semiconductor switch), the second transistor switch, which is off, and the second diode can keep the voltage across the main semiconductor switch from discharging through the secondary winding. The Zener diode can further reduce power leakage during a steady state.

In another example, two secondary windings in the transformer are used to provide the asymmetrical voltage bias. During a turn-on transient, the transformer can provide a positive voltage pulse that will induce a positive voltage in the first secondary winding. The positive voltage in the first secondary winding causes the second transistor switch to open and opens a current path from the first secondary winding, through a first diode, through the main semiconductor switch, through the second transistor switch, and back to the first secondary winding. During a turn-off transient, the pulse transformer can provide a negative voltage pulse that will induce a negative voltage in the second secondary winding. The negative voltage in the second secondary winding causes the first transistor switch to open, and opens a current path from the second secondary winding, through a second diode, through the main semiconductor switch, through the first transistor switch, and back to the second secondary winding. The ratio of turns between the primary winding and each of the first and second secondary windings can be individually adjusted to provide the desired asymmetrical voltage bias.

Emerging SiC power semiconductor switches, such as SiC MOSFETs can have advantages over traditional Si main semiconductor switches, such as higher blocking voltage, higher switching speed, and higher operating temperature. But, the driving strategy of SiC MOSFETs can be slightly different from that of Si MOSFETs. Instead of allowing symmetrical voltage biases in gate drive signals (e.g. ±10 V), SiC MOSFETs can have a maximum gate voltage ranging from −10 V to +25 V. Generally, these devices require a +20 V gate voltage to turn on and achieve the smallest on-state resistance between the drain and source $R_{DS(on)}$, and −5 V to turn off and guarantee a sufficient gate threshold $V_{GS(th)}$ margin especially at high temperature, since $V_{GS(th)}$ is only about 1.4 V at 200° C. Existing pulse-transformer-based gate drive circuits may only generate either a unipolar gate voltage (e.g., 0 to +20 V, or −20 to 0 V, depending on the component polarity), or a symmetrical bipolar gate voltage (e.g., ±10 V), neither of which satisfies the driving requirements for SiC MOSFETs, especially at high temperatures.

The differential driver circuit can include two drivers, such as ground-referenced, low-side MOSFET drivers, that are powered by a power supply voltage. The first driver can receive an original pulse-width-modulation (PWM) signal that includes control information for turning the main semiconductor switch on or off. The same PWM signal is delayed by a certain time $t_{pw}$ and then feeds the input of the second driver. The difference of the outputs of the first and second drivers is then composed of a positive voltage pulse followed by a negative voltage pulse, with the frequency of the original PWM, the pulse width of $t_{pw}$, and the magnitude of the power supply voltage ($V_{CC}$). The difference of the outputs of the first and second drivers is the pulse signal.

In alternate embodiments, instead of a PWM signal and a delayed PWM signal, a derived activate pulse can be provided to the first driver and a derived deactivate pulse can be provided to the second driver. The derived activate pulse and derived deactivate pulse can be positive voltage pulses of pulse width $t_{pw}$ that are derived from the beginning and end of a PWM signal.

A capacitor ($C_P$) can be included in the differential driver circuit to block the DC component of the outputs of the first and second drivers, which can be zero, and provide volt·second balance on the transformer. The capacitor can be a μF-range capacitor (e.g., 47 μF, 10 V). In some cases, the $C_P$ average voltage can be zero and the voltage ripple can be small enough to be negligible. The pulse signal can directly apply to the transformer.

The transformer can transfer the pulse signal to its secondary side, with a voltage boost determined by its turns-ratio (N). Assuming an ideal transformer, the secondary-side voltage will have the same shape as the voltage supplied to the primary side. In an example, the secondary side has a center tap that divides the secondary voltage by two. In another example, the secondary side includes a first secondary winding and a second secondary winding. Asymmetrical voltages in different parts of the charge and lock circuit can be achieved by the turns-ratio ($N_1$) between the primary winding and the first secondary winding being different than the turns-ratio ($N_2$) between the primary winding and the second secondary winding.

A gate driver according to certain examples is able to operate with a simplified circuit design, including without the need for a floating power supply and its associated transformer and rectification circuit. Since no floating power supply is needed, and since the transformer is able to transfer both power and control signals at the same time (e.g., in the pulse signal), a gate driver according to certain examples is able to operate with no start-up wait time. The power used to turn the main semiconductor switch on or off comes from the pulse signal, and does not need to be built up in any sort of capacitor that would otherwise be located between the transformer and the main semiconductor switch. A gate driver according to certain examples can also operate with a wide switching frequency and with a wide duty cycle range. Permanent or extended on/off state is also possible due to the low leakage rates of the charge and lock circuit and the ability for a refreshing positive voltage pulse or negative voltage pulse to be applied periodically to keep the $V_{GS}$ of the main semiconductor switch at the required turn-on or turn-off levels, respectively.

Additionally, a gate driver according to certain examples is able to operate using a simple and small transformer design. Since the PWM signal does not directly feed the transformer and the transformer is instead fed by a pulse signal having pulses with constant width regardless of the switching frequency, the transformer volt·second product is constant for all frequencies. Therefore, the transformer can be designed independent of switching frequency. Furthermore, the pulse width ($t_{pw}$) can be set to be only hundreds of nanoseconds (ns), making $V_{CC}·t_{pw}$ a very small value, and hence a very small transformer size can be achieved.

A gate driver according to certain examples can also operate with high reliability at high temperature. The use of a small count of components and the use of types of components that are easily obtainable in high-temperature-rating variants may increase the reliability of the gate driver at high temperatures.

A gate driver according to certain examples provides asymmetrical bipolar output voltages that are suitable for new voltage-driven SiC switches. The gate driver can be easily adjusted to drive conventional Si power MOSFETs and insulated-gate bipolar transistors (IGBTs). For example, in an H-bridge power transmitter, both the top and bottom switches can be driven with a gate driver according to certain examples. A gate driver according to certain examples provides a small size and high reliability in high temperature environments.

A transformer with multiple secondary windings can provide increased stability in varying temperatures (e.g., when varying from a low temperature to a high temperature), at least due to the output voltage of the deactivation path being determined by the transformer turns-ratio instead of an electronic component such as a Zener diode.

The various embodiments described above all include systems and methods for driving a main semiconductor switch. The main semiconductor switch can be coupled to a switched component. The main semiconductor switch can control power being supplied to the switched component. Power can be supplied from a separate power source that is coupled to the switched component through the main semiconductor switch. The separate power source can supply a much higher power than the power used to drive the main semiconductor switch. The separate power source can be any power source suitable for operating the switched component.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may be drawn not to scale.

FIG. 1 is a schematic diagram of a wellbore servicing system 100 that includes a tool 108 having a main semiconductor switch 110 driven by a gate driver 112 according to certain aspects of the disclosure. The wellbore servicing system 100 also includes a wellbore 102 penetrating a subterranean formation 104 for the purpose of recovering hydrocarbons, storing hydrocarbons, disposing of carbon dioxide, or the like. The wellbore 102 can be drilled into the subterranean formation 104 using any suitable drilling technique. While shown as extending vertically from the surface in FIG. 1, in other examples the wellbore 102 can be deviated, horizontal, or curved over at least some portions of the wellbore 102. The wellbore 102 can be cased, open hole, contain tubing, and can include a hole in the ground having a variety of shapes or geometries.

A service rig (not shown), such as a drilling rig, a completion rig, a workover rig, or other mast structure or combination thereof can support the tool 108 in the wellbore 102, but in other examples a different structure can support the tool 108. The tool 108 can be further supported by a conveyance 106, which can be a wireline, slickline, cable, tubular (e.g., drill string, casing string, completion string, coiled tubing, or the like), or other structure suitable for supporting the tool 108. In some aspects, a service rig can include a derrick (not shown) with a rig floor through which the line 106 extends downward from the service rig into the wellbore 102. In an offshore situation, the service rig can be supported by piers extending downwards to a seabed in some implementations. Alternatively, the service rig can be supported by columns sitting on hulls or pontoons (or both) that are ballasted below the water surface, which may be referred to as a semi-submersible platform or rig. In an off-shore location, tubing may extend from the service rig to exclude sea water and contain drilling fluid returns. Other mechanical mechanisms that are not shown may control the run-in and withdrawal of the line 106 in the wellbore 102. Examples of these other mechanical mechanisms include a draw works coupled to a hoisting apparatus, a slickline unit or a wireline unit including a winching apparatus, another servicing vehicle, or other such mechanisms. The tool 108 can be located in or part of a sonde, a bottom hole assembly, a completion string, or other downhole tool or apparatus.

The tool 108, such as a downhole logging tool, can include a main semiconductor switch 110 coupled to a gate driver 112. The main semiconductor switch 110 can be a power MOSFET. The gate driver 112 can be coupled to a signal source 114. The gate driver 112 can be coupled to the signal source 114 wirelessly or through a wire or other conductor. The signal source 114 can be located on or near the tool 108, elsewhere within the wellbore 102, or on the surface. The signal source 114 can provide a control signal (e.g., a PWM signal) to the gate driver 112 to close or open the main semiconductor switch 110. The main semiconductor switch 110 can control power to the tool 108 or to one or more specific modules of the tool 108. A power supply 116, coupled to the gate driver 112, can be located on or near the tool 108, elsewhere within the wellbore 102, or on the surface. The power supply 116 can be integrated into the signal source 114, or separate from the signal source 114.

Figure 2:
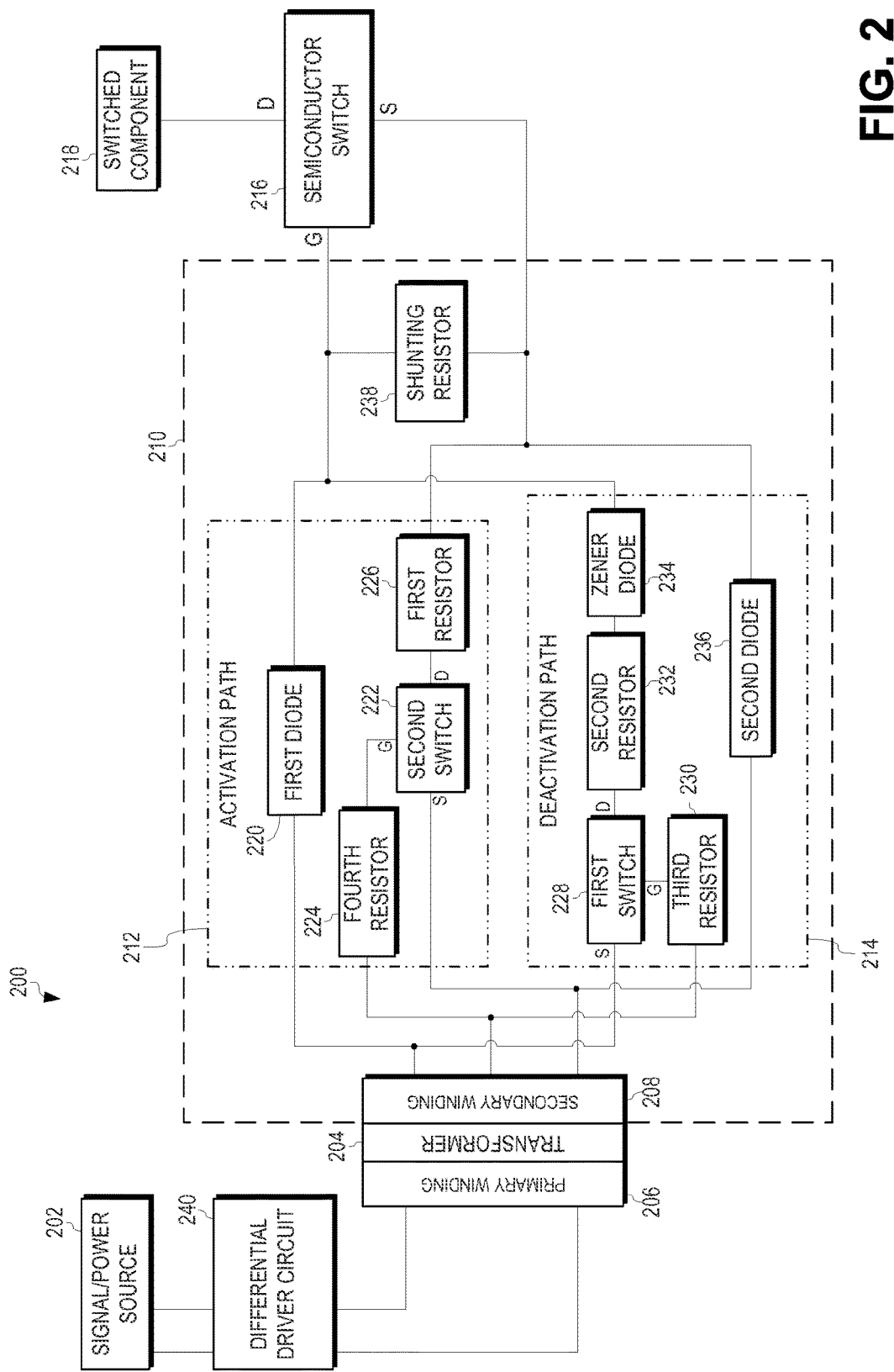
FIG. 2 is a schematic block diagram depicting a gate driver having two transistor switches according to certain aspects of the disclosure.

FIG. 2 is a schematic block diagram depicting a gate driver 200 having two transistor switches (depicted as a first transistor switch 228 and a second transistor switch 222) according to certain aspects of the disclosure. A signal/power source 202 can provide a control signal and power to a differential driver circuit 240. The signal/power source 202 can include a signal source and a power supply. The signal source can provide a pulse-width-modulated (PWM) signal to the differential driver circuit 240. The differential driver circuit 240 can use the PWM signal and power supplied by the power supply to drive a primary winding 206 of a transformer 204 with a pulse signal. The transformer 204 can be a pulse transformer. The pulse signal provided to the transformer 204 can be transferred into a charge and lock circuit 210 via a secondary winding 208. The ratio between the primary winding 206 and secondary winding 208 can determine any voltage boost or drop between the pulse signal supplied by the differential driver circuit 240 and the pulse signal provided to the charge and lock circuit 210.

The charge and lock circuit 210 can be coupled to the gate and source of a main semiconductor switch 216. A shunting resistor 238 can be coupled between the gate and source of the main semiconductor switch 216.

The charge and lock circuit 210 can include an activation path 212 and a deactivation path 214. The activation path 212 can include a first diode 220, the second transistor switch 222, a first resistor 226, and a fourth resistor 224. The first diode 220 can be coupled between a first end of the secondary winding 208 and the gate of the main semiconductor switch 216. The source of the second transistor switch 222 can be coupled to the second end of the secondary winding 208. The drain of the second transistor switch 222 can be coupled, through the first resistor 226, to the source of the main semiconductor switch 216. The gate of the second transistor switch 222 can be coupled, through the fourth resistor 224, to the tap of the secondary winding 208. The first resistor 226 can act to adjust the turn-on speed of the main semiconductor switch 216. The fourth resistor 224 can act to adjust the turn-on speed of the second transistor switch 222.

The deactivation path 214 can include a second diode 236, the first transistor switch 228, a second resistor 232, a Zener diode 234, and a third resistor 230. The second diode 236 can be coupled between the second end of the secondary winding 208 and the source of the main semiconductor switch 216. The source of the first transistor switch 228 can be coupled to the first end of the secondary winding 208. The drain of the first transistor switch 228 can be coupled, through the second resistor 232 and the Zener diode 234, to the gate of the main semiconductor switch 216. The gate of the first transistor switch 228 can be coupled to the tap of the secondary winding 208 through the third resistor 230. The second resistor 232 can act to adjust the turn-off speed of the main semiconductor switch 216. The third resistor 230 can act to adjust the turn-on speed of the first transistor switch 228. The Zener diode 234 can provide a blockage voltage that must be overcome in order to allow current to pass through the deactivation path 214, thus enabling the activation path 212 and deactivation path 214 to provide asymmetrical voltages.

When a positive voltage pulse is passed through the transformer 204, the second transistor switch 222 is opened due to the positive voltage applied between the gate and source of the second transistor switch 222, thus allowing current to flow through the activation path 212, which in turn applies a positive voltage across the gate and source of the main semiconductor switch 216. The positive voltage applied across the gate and source of the main semiconductor switch 216 is above the threshold voltage of the main semiconductor switch 216, thus enabling the main semiconductor switch 216 to allow current to flow from its drain to its source (e.g., turning the main semiconductor switch 216 on). When the main semiconductor switch 216 is on, power can be supplied to the switched component 218. Power can be supplied to the switched component 218 from a separate power source (not pictured) coupled to the switched component 218 through the main semiconductor switch 216.

When a negative voltage pulse is passed through the transformer 204, the first transistor switch 228 is opened due to the positive voltage applied between the gate and source of the first transistor switch 228, thus allowing current to flow through the deactivation path 214, which in turn applies a negative voltage across the gate and source of the main semiconductor switch 216. The negative voltage applied across the gate and source of the main semiconductor switch 216 is sufficiently below the threshold voltage of the main semiconductor switch 216, thus ensuring the main semiconductor switch 216 does not allow current to flow from its drain to its source (e.g., turning the main semiconductor switch 216 off). When the main semiconductor switch 216 is off, power is not supplied to the switched component 218.

Figure 3:
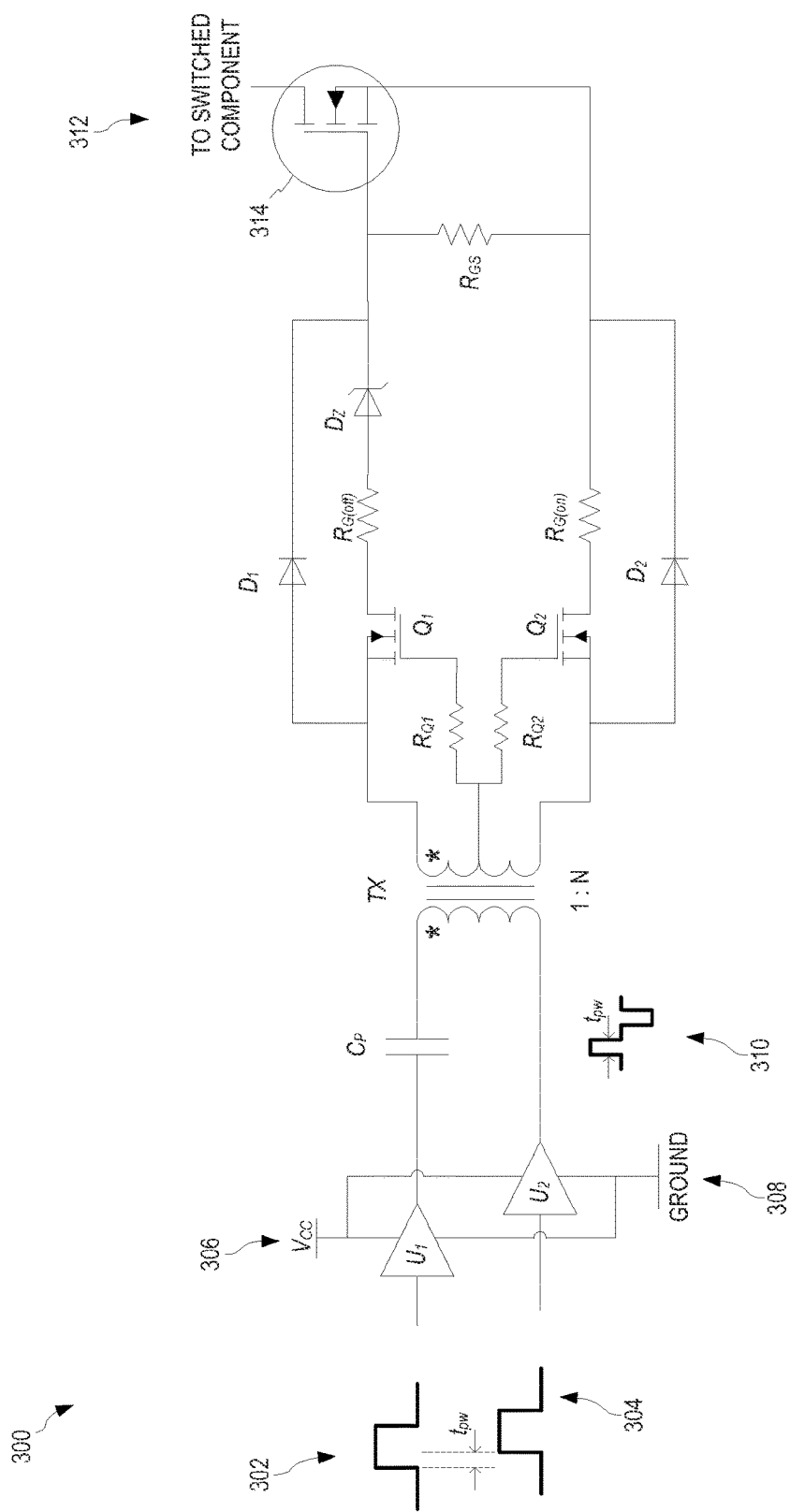
FIG. 3 is a schematic circuit diagram depicting a gate driver having two transistor switches according to certain aspects of the disclosure.

FIG. 3 is a schematic circuit diagram depicting a gate driver 300 having two transistor switches $Q_1$, $Q_2$ according to certain aspects of the disclosure. The charge and lock circuit can include a first transistor switch ($Q_1$) and a second transistor switch ($Q_2$) which are both field-effect transistors (FETs). The first and second transistor switches can be enhancement-mode Si N-MOSFETs (e.g., made with a p-type substrate), whose gates are connected to the center tap through their respective gate resistors ($R_{Q1}$ and $R_{Q2}$). The charge and lock circuit can further include first and second diodes ($D_1$ and $D_2$) (e.g., Si Schottky diodes) and a Zener diode ($D_Z$). Each switching cycle (turn-on and then turn-off) can be divided into four phases, including a turn-on phase, a stay-on phase, a turn-off phase, and a stay-off phase. The turn-on phase occurs in response to a positive voltage pulse being passed to the charge and lock circuit, the stay-on phase occurs in response to a neutral voltage pulse that occurs after the positive voltage pulse, the turn-off phase occurs in response to a negative voltage pulse, and the stay-off phase occurs in response to a neutral voltage pulse that occurs after the negative voltage pulse.

A PWM signal 302 is provided to a first driver $U_1$ and a delayed PWM signal 304 is provided to a second driver $U_2$. The delayed PWM signal 304 can be created by passing the PWM signal 302 through a signal delay circuit. The signal delay circuit can delay the PWM signal 302 by a delay time $t_{pw}$ in order to create the delayed PWM signal 304. The first and second drivers $U_1$, $U_2$ are provided power from a voltage source 306 and ground 308. The first driver and second driver $U_1$, $U_2$ are coupled to opposite sides of a primary winding of a transformer TX. The first driver and second driver $U_1$, $U_2$ operate to generate a pulse signal 310 from the PWM signal 302. The pulse signal 310 can have a pulse width that is equal to the delay time $t_{pw}$. The voltage of the pulse signal 310 can be based on the voltage source 306. Optionally, a capacitor $C_P$ can be placed in series with the first driver and second driver $U_1$, $U_2$. The capacitor $C_P$ can remove the direct current (DC) component of the pulse signal 310.

The charge and lock circuit can include an activation path that includes a first diode $D_1$, the main semiconductor switch 314, a first resistor $R_{G(on)}$, the second transistor switch $Q_2$, and a fourth resistor $R_{Q2}$. The charge and lock circuit can also include a deactivation path that includes the second diode $D_2$, the main semiconductor switch 314, the Zener diode $D_Z$, the second resistor $R_{G(off)}$, the first main semiconductor switch $Q_1$, and the third resistor $R_{Q1}$. The charge and lock circuit can also include a shunting resistor $R_{GS}$. The main semiconductor switch 314 can allow or block current flow to a switched component 312 coupled to the drain of the main semiconductor switch 314.

If assuming an ideal transformer and neglecting the voltage drops on $Q_1$, $Q_2$, $D_1$, $D_2$, and the other resistors, the main semiconductor switch gate voltage can be estimated by $V_{GS(on)}=V_{CC}*N$ for turn-on and $V_{GS(off)}=-(V_{CC}*N-V_Z)$ for turn-off, where $V_Z$ is the clamping voltage of $D_Z$. In an example, to get +20 V/-5 V on the gate of the main semiconductor switch 314, let $V_{CC}=20$ V, N=1, and $V_Z=15$ V. Because of the center tap, $Q_1$ and $Q_2$ will receive ±10 V on their respective gate terminals, which is a safe voltage for most low-voltage, low-power Si MOSFETs.

$R_{GS}$ is a shunting resistor in the range of 10-20 kΩ which prevents the gate of the main MOSFET from floating when the gate drive circuit is not powered on. Other ranges for the shunting resistor can be used as appropriate.

In alternate embodiments, $D_1$, $D_2$, or both $D_1$ and $D_2$ can be omitted. When $D_1$ is omitted, the activation path includes $Q_1$, $R_{G(off)}$, $D_Z$ (forward-biased), the main semiconductor switch 314, $R_{G(on)}$, and $Q_2$. When $D_2$ is omitted, the deactivation path includes $Q_2$, $R_{G(on)}$, $D_Z$ (reversed-biased and clamping), the main semiconductor switch 314, $R_{G(off)}$, and $Q_1$. When $D_1$, $D_2$, or both $D_1$ and $D_2$ are omitted, the charge and lock circuit may operate less efficiently due to more voltage and energy loss occurring as the current must pass through additional components in the activation and deactivation paths. Additionally, the ability to fine tune the turn-on and turn-off speeds may be lost due to the activation and deactivation paths each including both the $R_{G(on)}$ and $R_{G(off)}$ resistors. However, fewer overall components would be required in the charge and lock circuit.

Figure 4:
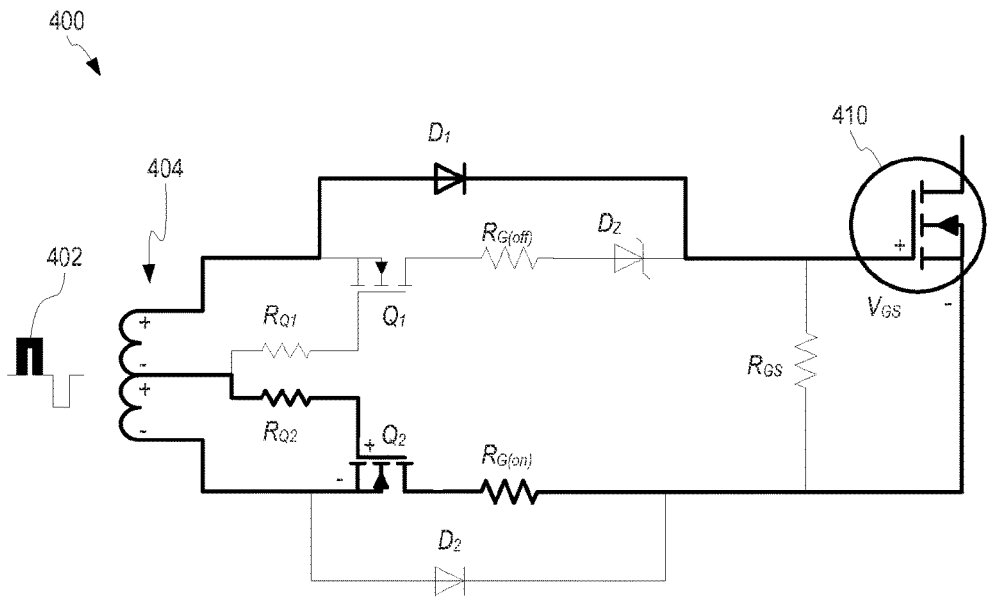
FIG. 4 is a schematic diagram of the charge and lock circuit of FIG. 3 during a turn-on phase according to certain aspects of the disclosure.

FIG. 4 is a schematic diagram of the charge and lock circuit 400 of FIG. 3 during a turn-on phase according to certain aspects of the disclosure. When a positive voltage pulse 402 is induced in the secondary winding 404, the positive voltage between a second end of the secondary winding 404 and the tap can turn on $Q_2$. The turn-on speed of $Q_2$ can be controlled through $R_{Q2}$. $D_1$ can become forward-biased and can start to conduct. Therefore, the gate capacitance of the main semiconductor switch 410 (e.g., main MOSFET) can be charged by the transformer secondary side through $D_1$, $R_{G(on)}$, and $Q_2$. $R_{G(on)}$ is a resistor used to control the charging current (e.g., an activation current passing through the activation path) and thus the turn-on speed of the main semiconductor switch 410.

Figure 5:
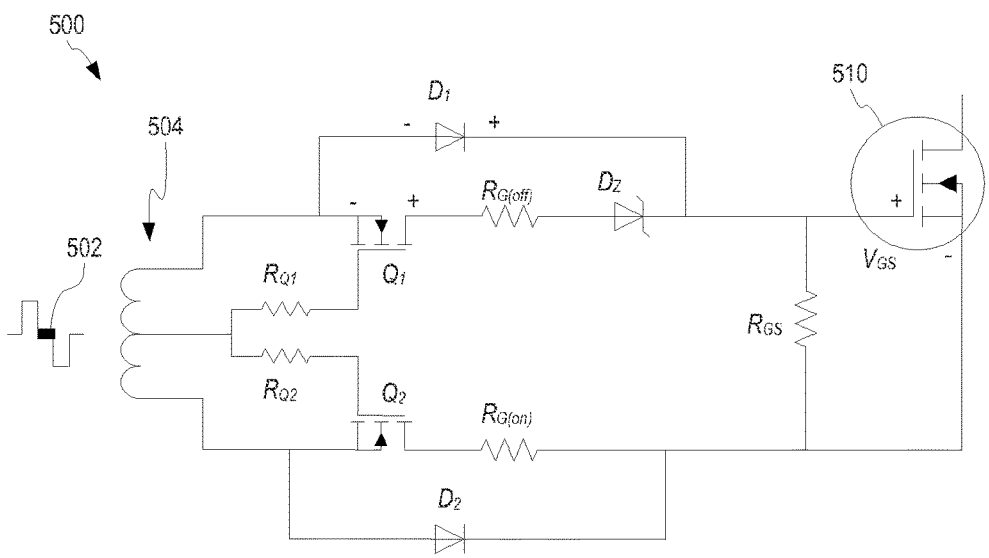
FIG. 5 is a schematic diagram of the charge and lock circuit of FIG. 3 during a stay-on phase according to certain aspects of the disclosure.

FIG. 5 is a schematic diagram of the charge and lock circuit 500 of FIG. 3 during a stay-on phase according to certain aspects of the disclosure. During the "on" state, a neutral voltage pulse 502 exists in the pulse signal, resulting in the secondary winding 504 being shorted, and thus both $Q_1$ and $Q_2$ are off. $Q_1$ and $D_1$ block the deactivation path of the gate capacitance of the main semiconductor switch 510, so the charge is trapped within the gate, and the gate voltage $V_{GS}$ will remain unchanged, in ideal circumstance. In practice, since $Q_1$ and $D_1$ change from being forward-biased to blocking $V_{GS}$, their junction capacitances will receive some charge from the main semiconductor switch gate capacitance. Therefore, the actual voltage across the gate and source of the main semiconductor switch $V_{GS}$ will drop slightly at the beginning of this phase.

Figure 6:
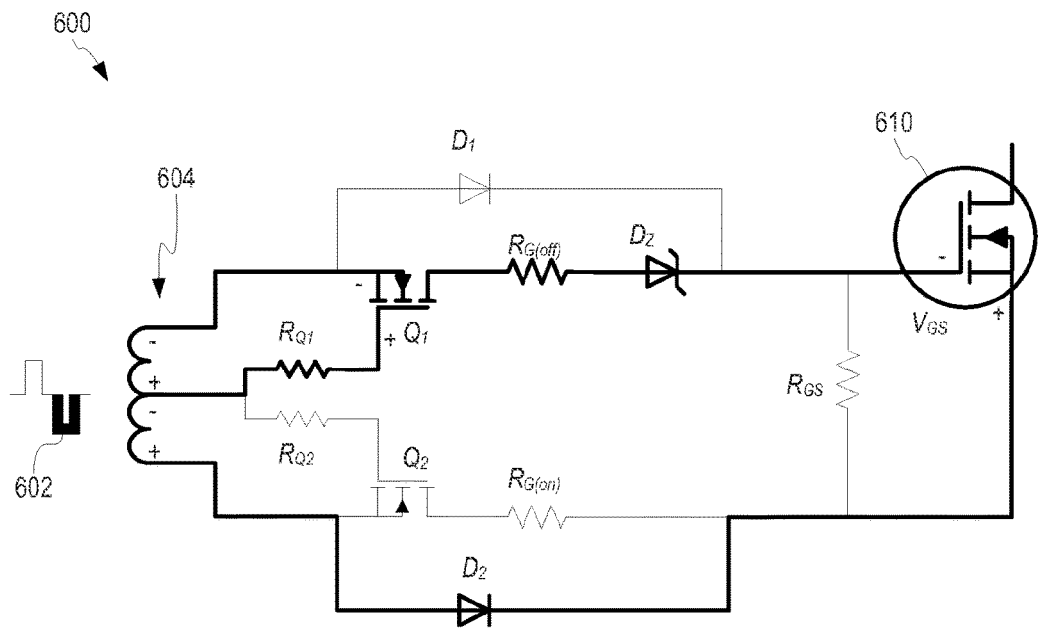
FIG. 6 is a schematic diagram of the charge and lock circuit of FIG. 3 during a turn-off phase according to certain aspects of the disclosure.

FIG. 6 is a schematic diagram of the charge and lock circuit 600 of FIG. 3 during a turn-off phase according to certain aspects of the disclosure. During the turn-off transient, a negative voltage pulse 602 is induced in the secondary winding 604, which turns on $Q_1$. The turn-on speed of $Q_1$ is controlled through $R_{Q1}$. $D_2$ can become forward-biased and can start to conduct. Therefore, the gate capacitance of the main semiconductor switch is discharged by the transformer's secondary winding 604 through $D_2$, $D_Z$, $R_{G(off)}$, and $Q_1$. $R_{G(off)}$ can be used to control the discharging current (e.g., a deactivation current passing through the deactivation path) and thus the turn-off speed of the main semiconductor switch 610. Different from the turn-on transient, however, at turn-off, the secondary-side voltage needs to overcome the clamping voltage of the Zener diode $D_Z$, leaving a smaller $V_{GS}$ than turn-on.

Figure 7:
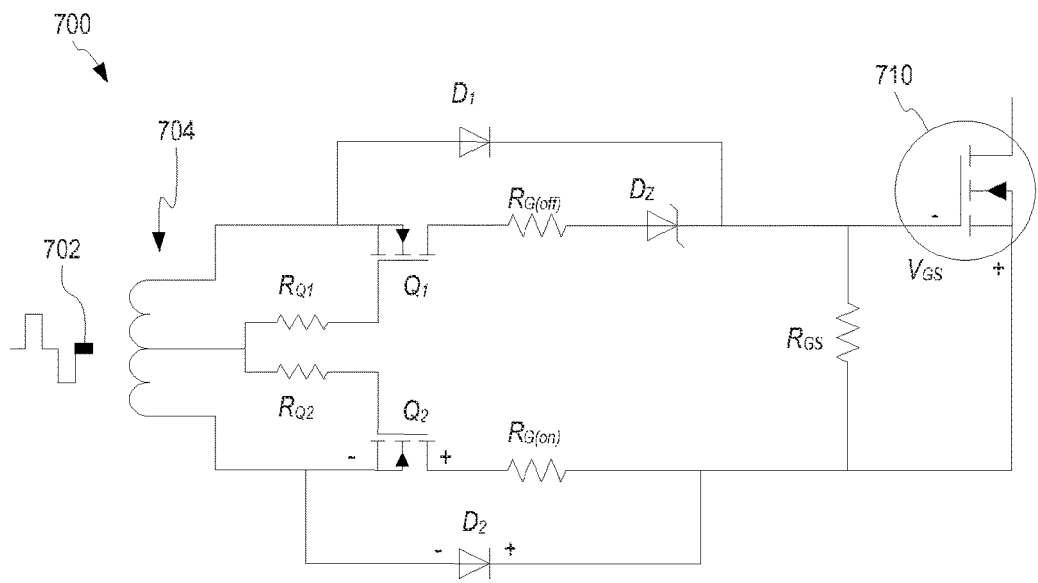
FIG. 7 is a schematic diagram of the charge and lock circuit of FIG. 3 during a stay-off phase according to certain aspects of the disclosure.

FIG. 7 is a schematic diagram of the charge and lock circuit 700 of FIG. 3 during a stay-off phase according to certain aspects of the disclosure. During the "off" state, a neutral voltage pulse 702 exists in the pulse signal, resulting in the secondary winding 704 being shorted, and thus both $Q_1$ and $Q_2$ are off. $Q_2$ and $D_2$ will block the deactivation path of the gate capacitance of the main semiconductor switch 710, so $V_{GS}$ will remain unchanged in ideal circumstances. In practice, $V_{GS}$ will drop slightly for the same reason as stated above during the "on" state.

Figure 8:
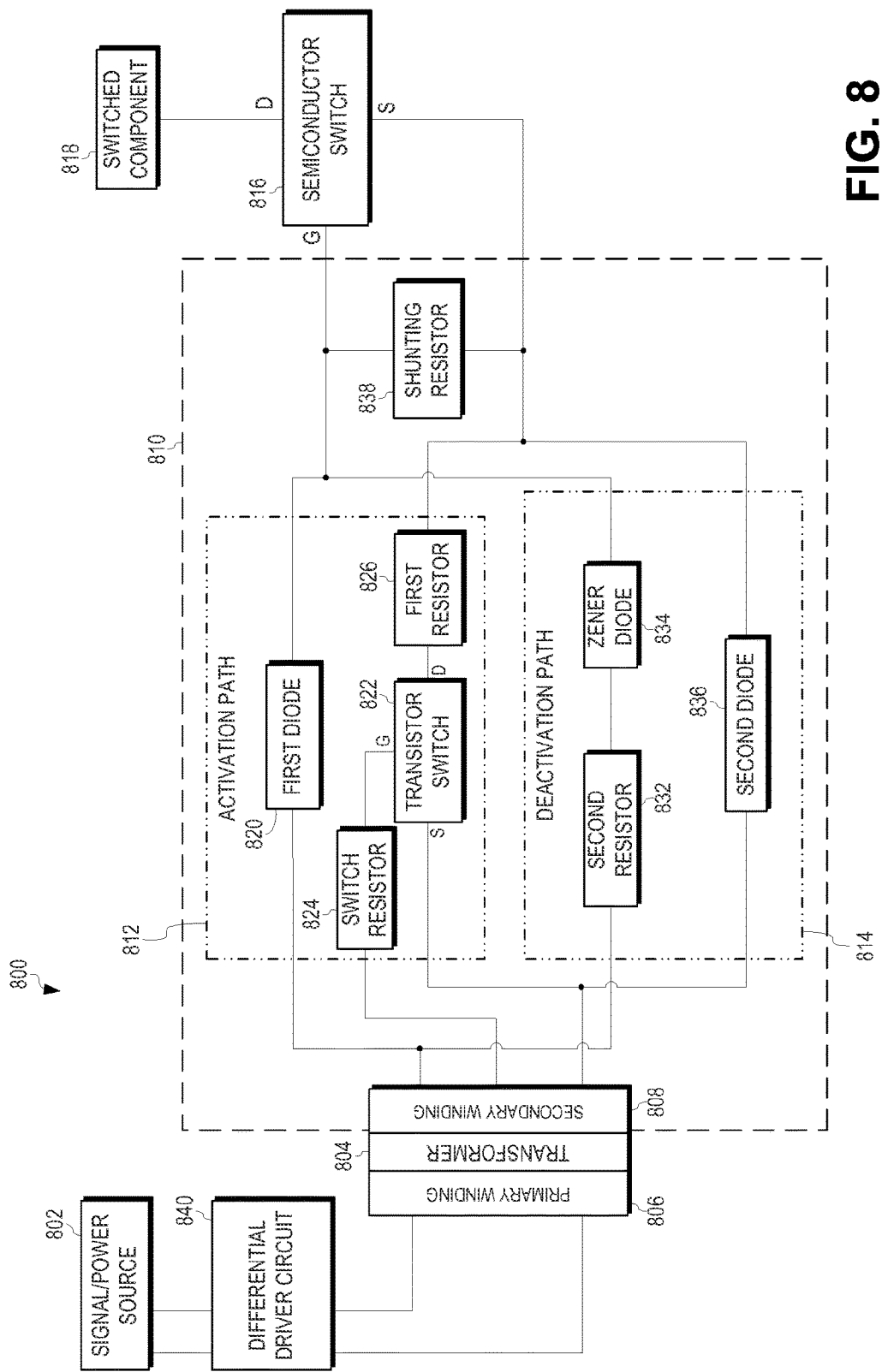
FIG. 8 is a schematic block diagram depicting a gate driver having one transistor switch according to certain aspects of the disclosure.

FIG. 8 is a schematic block diagram depicting a gate driver 800 having one transistor switch 822 according to certain aspects of the disclosure. A signal/power source 802 can provide a control signal and power to a differential driver circuit 840. The signal/power source 802 can include a signal source and a power supply. The signal source can provide a pulse-width-modulated (PWM) signal to the differential driver circuit 840. The differential driver circuit 840 can use the PWM signal and power supplied by the power supply to drive a primary winding 806 of a transformer 804 with a pulse signal. The transformer 804 can be a pulse transformer. The pulse signal provided to the transformer 804 can be transferred into a charge and lock circuit 810 via a secondary winding 808. The ratio between the primary winding 806 and secondary winding 808 can determine any voltage boost or drop between the pulse signal supplied by the differential driver circuit 840 and the pulse signal provided to the charge and lock circuit 810.

The charge and lock circuit 810 can be coupled to the gate and source of a main semiconductor switch 816. A shunting resistor 838 can be coupled between the gate and source of the main semiconductor switch 816.

The charge and lock circuit 810 can include an activation path 812 and a deactivation path 814. The activation path 812 can include a first diode 820, a transistor switch 822, a first resistor 826, and a switch resistor 824. The first diode 820 can be coupled between a first end of the secondary winding 808 and the gate of the main semiconductor switch 816. The source of the transistor switch 822 can be coupled to the second end of the secondary winding 808. The drain of the transistor switch 822 can be coupled, through the first resistor 826, to the source of the main semiconductor switch 816. The gate of the transistor switch 822 can be coupled, through the switch resistor 824, to the tap of the secondary winding 808. The first resistor 826 can act to adjust the turn-on speed of the main semiconductor switch 816. The switch resistor 824 can act to adjust the turn-on speed of the transistor switch 822.

The deactivation path 814 can include a second diode 836, a second resistor 832, and a Zener diode 834. The second diode 836 can be coupled between the second end of the secondary winding 808 and the source of the main semiconductor switch 816. The second resistor 832 can be coupled to the first end of the secondary winding 808 and to the gate of the main semiconductor switch 816 through the Zener diode 834. The second resistor 832 can act to adjust the turn-off speed of the main semiconductor switch 816. The Zener diode 834 can provide a blockage voltage that must be overcome in order to allow current to pass through the deactivation path 814, thus enabling the activation path 812 and deactivation path 814 to provide asymmetrical voltages.

When a positive voltage pulse is passed through the transformer 804, the transistor switch 822 is opened due to the positive voltage applied between the gate and source of the transistor switch 822, thus allowing current to flow through the activation path 812, which in turn applies a positive voltage across the gate and source of the main semiconductor switch 816. The positive voltage applied across the gate and source of the main semiconductor switch 816 is above the threshold voltage of the main semiconductor switch 816, thus enabling the main semiconductor switch 816 to allow current to flow from its drain to its source (e.g., turning the main semiconductor switch 816 on). When the main semiconductor switch 816 is on, power can be supplied to the switched component 818.

When a negative voltage pulse is passed through the transformer 804, current flows through the deactivation path 814, as described in further detail below, which in turn applies a negative voltage across the gate and source of the main semiconductor switch 816. The negative voltage applied across the gate and source of the main semiconductor switch 816 is sufficiently below the threshold voltage of the main semiconductor switch 816, thus ensuring the main semiconductor switch 816 does not allow current to flow from its drain to its source (e.g., turning the main semiconductor switch 816 off). When the main semiconductor switch 816 is off, power is not supplied to the switched component 818.

Figure 9:
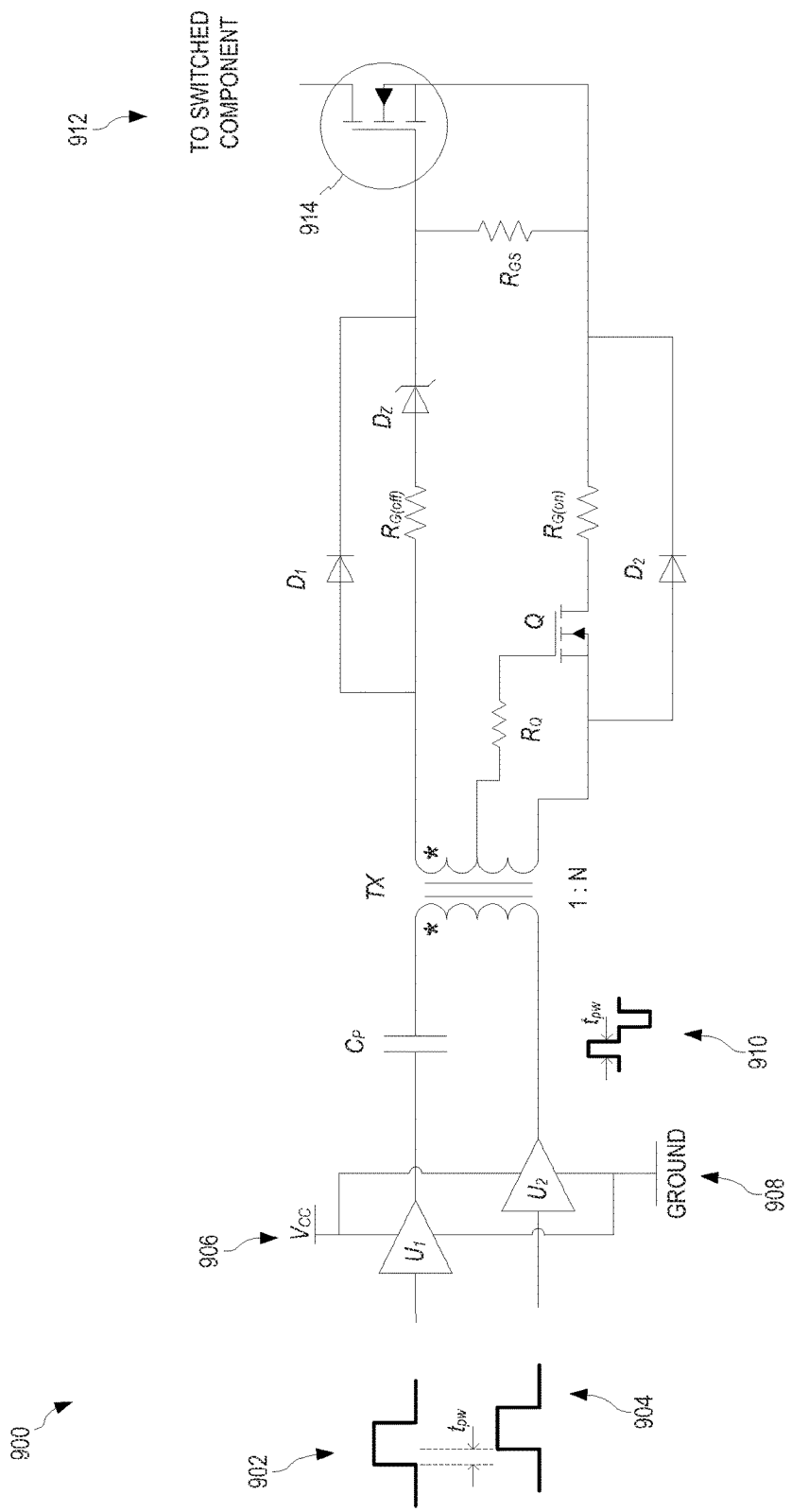
FIG. 9 is a schematic circuit diagram depicting a gate driver having one transistor switch according to certain aspects of the disclosure.

FIG. 9 is a schematic circuit diagram depicting a gate driver 900 having one transistor switch Q according to certain aspects of the disclosure. The charge and lock circuit can include one transistor switch Q which can be a field-effect transistor (FET). The transistor switch can be an enhancement-mode Si N-MOSFET (e.g., made with a p-type substrate), whose gate is connected to the center tap through a switch resistor $R_Q$. The charge and lock circuit can further include first and second diodes $D_1$, $D_2$ (e.g., Si Schottky diodes) and a Zener diode $D_Z$. Each switching cycle (turn-on and then turn-off) can be divided into four phases, including a turn-on phase, a stay-on phase, a turn-off phase, and a stay-off phase. The turn-on phase occurs in response to a positive voltage pulse being passed to the charge and lock circuit, the stay-on phase occurs in response to a neutral voltage pulse that occurs after the positive voltage pulse, the turn-off phase occurs in response to a negative voltage pulse, and the stay-off phase occurs in response to a neutral voltage pulse that occurs after the negative voltage pulse.

A PWM signal 902 is provided to a first driver $U_1$ and a delayed PWM signal 904 is provided to a second driver $U_2$. The delayed PWM signal 904 can be created by passing the PWM signal 902 through a signal delay circuit. The signal delay circuit can delay the PWM signal 902 by a delay time $t_{pw}$ in order to create the delayed PWM signal 904. The first and second drivers $U_1$, $U_2$ are provided power from a voltage source 906 and ground 908. The first driver and second driver $U_1$, $U_2$ are coupled to opposite sides of the primary winding of the transformer TX. The first driver and second driver $U_1$, $U_2$ operate to generate a pulse signal 910 from the PWM signal 902. The pulse signal 910 can have a pulse width that is equal to the delay time $t_{pw}$. The voltage of the pulse signal 910 can be based on the voltage source 906. Optionally, a capacitor $C_P$ can be placed in series with the first driver and second driver $U_1$, $U_2$. The capacitor $C_P$ can remove the direct current (DC) component of the pulse signal 910.

The charge and lock circuit can include an activation path that includes a first diode $D_1$, the main semiconductor switch 914, a first resistor $R_{G(on)}$, the transistor switch Q, and a switch resistor $R_Q$. The charge and lock circuit can also include a deactivation path that includes the second diode $D_2$, the main semiconductor switch 914, the Zener diode $D_Z$, and the second resistor $R_{G(off)}$. The charge and lock circuit can also include a shunting resistor $R_{GS}$. The main semiconductor switch 914 can allow or block current flow to a switched component 912 coupled to the drain of the main semiconductor switch 914.

$R_{GS}$ is a shunting resistor in the range of 10-20 kΩ which prevents the gate of the main MOSFET from floating when the gate drive circuit is not powered on. Other ranges for the shunting resistor can be used as appropriate.

Unlike the charge and lock circuit from FIG. 3, the charge and lock circuit from FIG. 9 only has one transistor switch Q. The charge and lock circuit is still able to generate a waveform on $V_{GS}$ that is very similar to the charge and lock circuit from FIG. 3. The switching process is very similar to FIG. 3, except that during the stay-on state, the gate voltage $V_{GS}$ will not hold at $V_{CC} \cdot N$, but will drop until it is clamped to $V_Z$ by the Zener diode $D_Z$. For this circuit, $V_{GS}$ can be estimated by $V_{GS(on,tr)} = V_{CC}*N$ for the turn-on transient (a period of $t_{pw}$); $V_{GS(on)} = V_Z$ for the "on" state; and $V_{GS(off)} = -(V_{CC}*N - V_Z)$ for turn-off.

As long as the circuit parameters are properly selected, bias voltages can be achieved that are very similar to the charge and lock circuit of FIG. 3. For example, if $V_{CC}$=25 V, N=1, and $V_Z$=20 V, one can still get +20 V for turn-on and −5 V for turn-off on the main semiconductor switch, only that a 25 V spike will appear at the rising edge of $V_{GS}$, which lasts for $t_{pw}$.

In alternate embodiments, $D_1$, $D_2$, or both $D_1$ and $D_2$ can be omitted. When $D_1$ is omitted, the activation path includes $R_{G(off)}$, $D_Z$ (forward-biased), the main semiconductor switch 914, $R_{G(on)}$, and Q. When $D_2$ is omitted, the deactivation path includes Q, $R_{G(on)}$, $D_Z$ (reversed-biased and clamping), the main semiconductor switch 914, and $R_{G(off)}$. When $D_1$, $D_2$, or both $D_1$ and $D_2$ are omitted, the charge and lock circuit may operate less efficiently due to more voltage and energy loss occurring as the current must pass through additional components in the activation and deactivation paths. Additionally, the ability to fine tune the turn-on and turn-off speeds may be lost due to the activation and deactivation paths each including both the $R_{G(on)}$ and $R_{G(off)}$ resistors. However, fewer overall components would be required in the charge and lock circuit.

Figure 10:
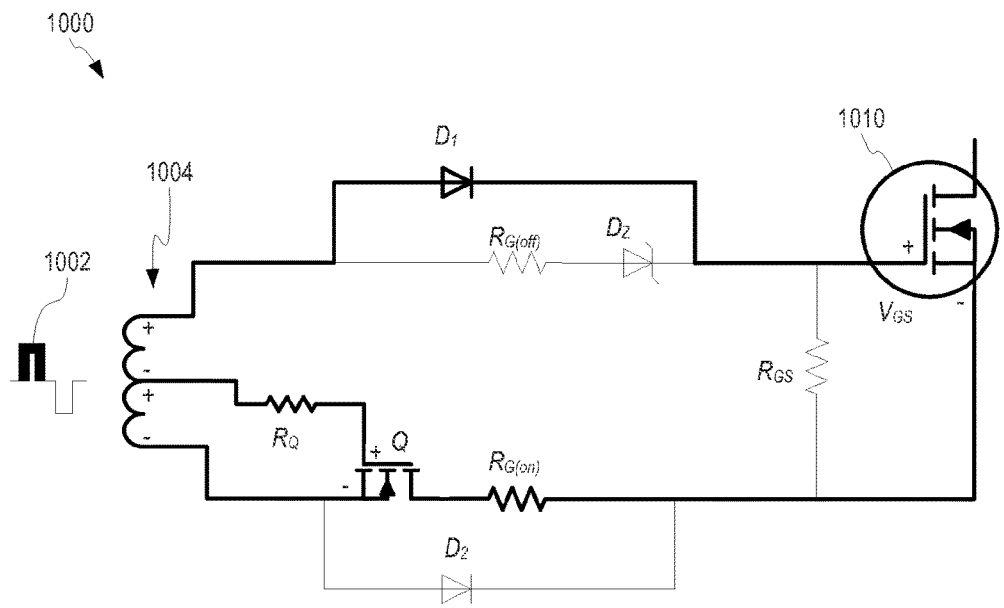
FIG. 10 is a schematic diagram of the charge and lock circuit of FIG. 8 during a turn-on phase according to certain aspects of the disclosure.

FIG. 10 is a schematic diagram of the charge and lock circuit 1000 of FIG. 8 during a turn-on phase according to certain aspects of the disclosure. When a positive voltage pulse 1002 is induced in the secondary winding 1004, the positive voltage between a second end of the secondary winding 1004 and the tap can turn on Q. The turn-on speed of Q can be controlled through $R_Q$. $D_1$ can become forward-biased and can start to conduct. Therefore, the gate capacitance of the main semiconductor switch 1010 (e.g., main MOSFET) can be charged by the transformer secondary side through $D_1$, $R_{G(on)}$, and Q. $R_{G(on)}$ is a resistor used to control the charging current (e.g., an activation current passing through the activation path) and thus the turn-on speed of the main semiconductor switch 1010.

Figure 11:
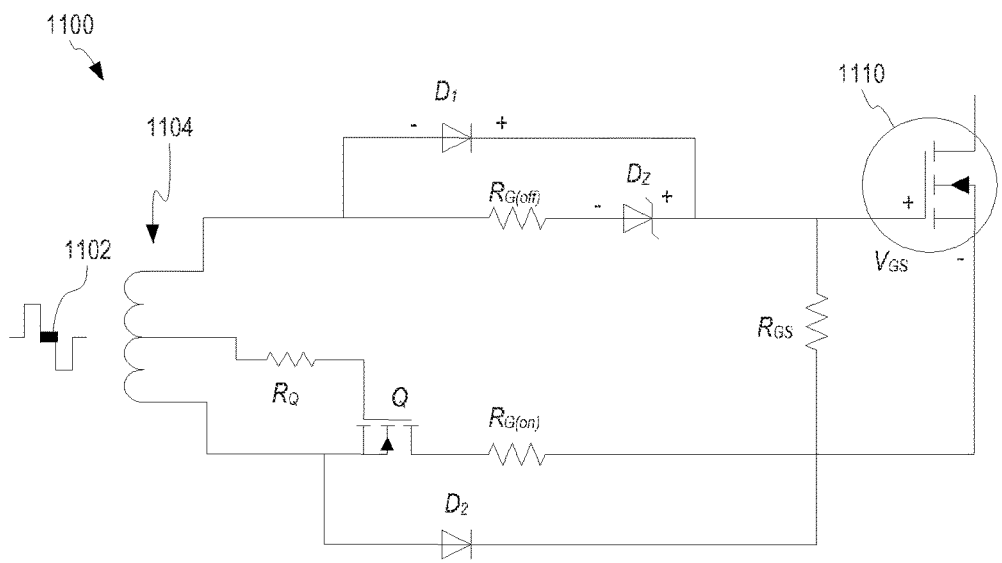
FIG. 11 is a schematic diagram of the charge and lock circuit of FIG. 8 during a stay-on phase according to certain aspects of the disclosure.

FIG. 11 is a schematic diagram of the charge and lock circuit 1100 of FIG. 8 during a stay-on phase according to certain aspects of the disclosure. During the "on" state, a neutral voltage pulse 1102 exists in the pulse signal, resulting in the secondary winding 1104 being shorted, and thus Q is off. As described above, the voltage across the main semiconductor switch 1110 will discharge slightly until the voltage drops below the clamping voltage of the Zener diode $D_Z$, at which point $D_Z$, along with $D_1$, will block the deactivation path of the gate capacitance of the main semiconductor switch 1110, trapping charge within the gate. The gate voltage $V_{GS}$ will therefore drop slightly at the beginning of the stay-on phase, but sufficient charge will be locked on the gate of the main semiconductor switch 1110 to keep the main semiconductor switch 1110 on.

Figure 12:
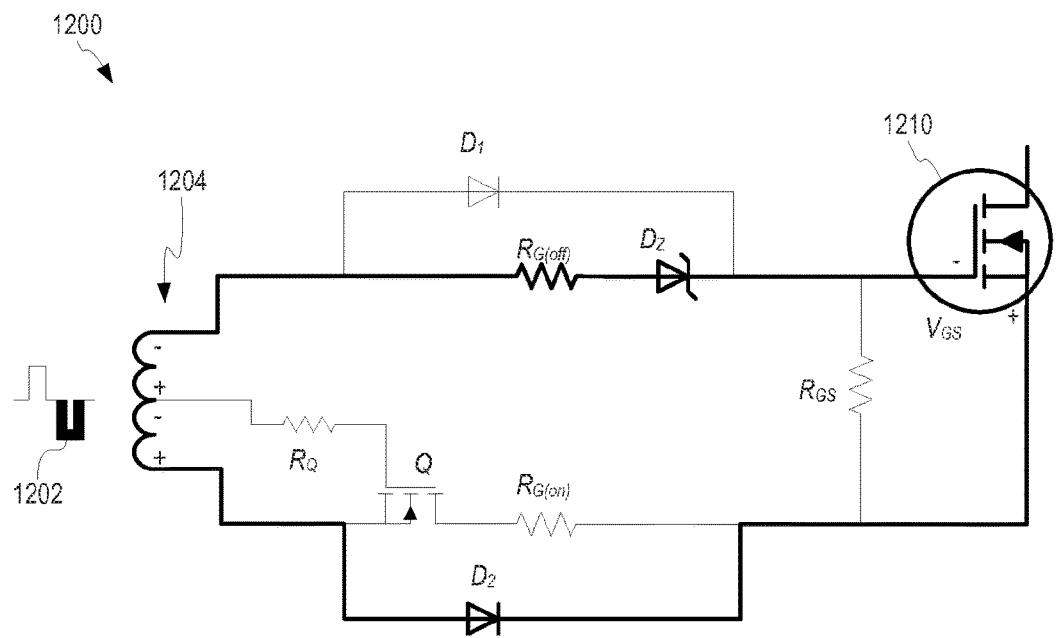
FIG. 12 is a schematic diagram of the charge and lock circuit of FIG. 8 during a turn-off phase according to certain aspects of the disclosure.

FIG. 12 is a schematic diagram of the charge and lock circuit 1200 of FIG. 8 during a turn-off phase according to certain aspects of the disclosure. During the turn-off transient, a negative voltage pulse 1202 is induced in the secondary winding 1204. $D_2$ can become forward-biased and can start to conduct. Therefore, the gate capacitance of the main semiconductor switch is discharged by the transformer secondary winding 1204 through $D_2$, $D_Z$, and $R_{G(off)}$. $R_{G(off)}$ can be used to control the discharging current (e.g., a deactivation current passing through the deactivation path) and thus the turn-off speed of the main semiconductor switch 1210. Different from the turn-on transient, however, at turn-off, the secondary-side voltage needs to overcome the clamping voltage of the Zener diode $D_Z$, leaving a smaller $V_{GS}$ than during turn-on.

Figure 13:
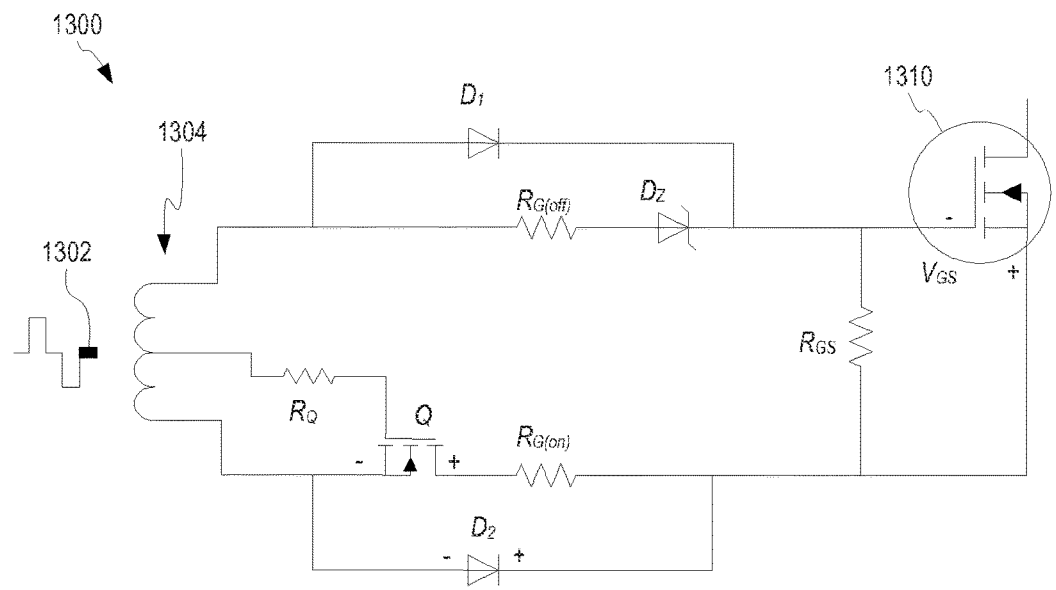
FIG. 13 is a schematic diagram of the charge and lock circuit of FIG. 8 during a stay-off phase according to certain aspects of the disclosure.

FIG. 13 is a schematic diagram of the charge and lock circuit 1300 of FIG. 8 during a stay-off phase according to certain aspects of the disclosure. During the "off" state, a neutral voltage pulse 1302 exists in the pulse signal, resulting in the secondary winding 1304 being shorted, and thus Q is off. Q and $D_2$ will block the deactivation path of the gate capacitance of the main semiconductor switch 1310, so $V_{GS}$ will remain unchanged in ideal circumstances. In practice, $V_{GS}$ will drop slightly for the same reason as stated above during the "on" state.

Figure 14:
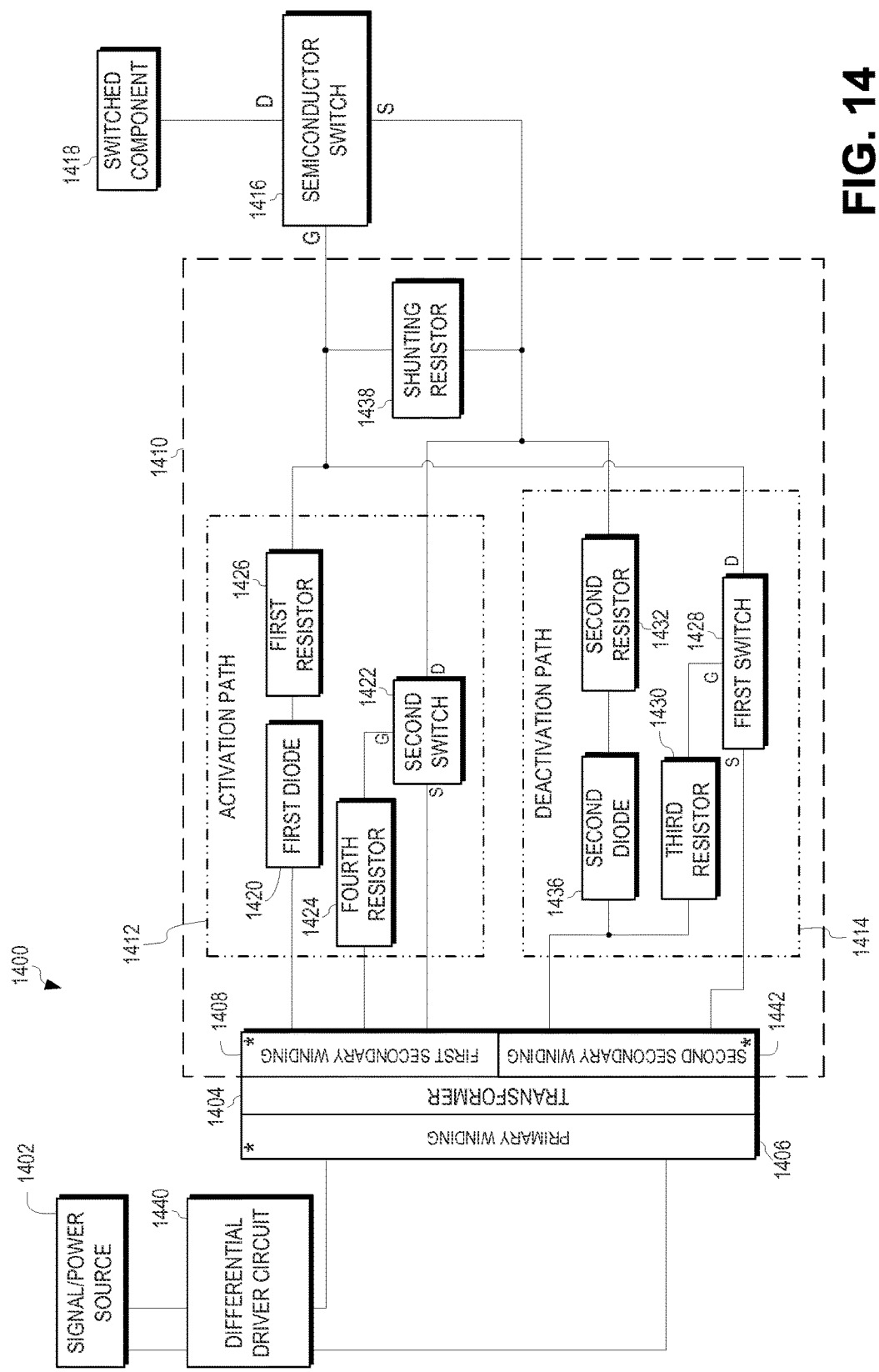
FIG. 14 is a schematic block diagram depicting a gate driver having two transistor switches and two secondary windings according to certain aspects of the disclosure.

FIG. 14 is a schematic block diagram depicting a gate driver 1400 having two transistor switches 1422, 1428 and two secondary windings 1408, 1442 according to certain aspects of the disclosure. A signal/power source 1402 can provide a control signal and power to a differential driver circuit 1440. The signal/power source 1402 can include a signal source and a power supply. The signal source can provide a pulse-width-modulated (PWM) signal to the differential driver circuit 1440. The differential driver circuit 1440 can use the PWM signal and power supplied by the power supply to drive a primary winding 1406 of a transformer 1404 with a pulse signal. The transformer 1404 can be a pulse transformer. The pulse signal provided to the transformer 1404 can be transferred into a charge and lock circuit 1410 via a first secondary winding 1408 and a second secondary winding 1442. The ratio between the primary winding 1406 and first secondary winding 1408 can determine any voltage boost or drop between the pulse signal supplied by the differential driver circuit 1440 and the pulse signal provided to the activation path 1412 of the charge and lock circuit 1410. The ratio between the primary winding 1406 and second secondary winding 1442 can determine any voltage boost or drop between the pulse signal supplied by the differential driver circuit 1440 and the pulse signal provided to the deactivation path 1414 of the charge and lock circuit 1410. Each of the first and second secondary windings 1408, 1442 can have a first end and a second end. The first end of the first and second secondary windings 1408, 1442 are indicated by an asterisk *. The first and second secondary windings 1408, 1442 are positioned on the transformer 1404 such that a voltage induced in the first and second secondary windings 1408, 1442 will have the same polarity as measured from each windings' respective first end to its respective second end.

The charge and lock circuit 1410 can be coupled to the gate and source of a main semiconductor switch 1416. A shunting resistor 1438 can be coupled between the gate and source of the main semiconductor switch 1416.

The charge and lock circuit 1410 can include an activation path 1412 and a deactivation path 1414. The activation path 1412 can include a first diode 1420, a second transistor switch 1422, a first resistor 1426, and a fourth resistor 1424. The first diode 1420 can be coupled to a first end of the first secondary winding 1408 and, through the first resistor 1426, to the gate of the main semiconductor switch 1416. The source of the second transistor switch 1422 can be coupled to the second end of the first secondary winding 1408. The drain of the second transistor switch 1422 can be coupled to the source of the main semiconductor switch 1416. The gate of the second transistor switch 1422 can be coupled, through the fourth resistor 1424, to the tap of the first secondary winding 1408. The first resistor 1426 can act to adjust the turn-on speed of the main semiconductor switch 1416. The fourth resistor 1424 can act to adjust the turn-on speed of the second transistor switch 1422.

The deactivation path 1414 can include a second diode 1436, a first transistor switch 1428, a second resistor 1432, and a third resistor 1430. The second diode 1436 can be coupled to the second end of the second secondary winding 1442 and, through the second resistor 1432, to the source of the main semiconductor switch 1416. The source of the first transistor switch 1428 can be coupled to the first end of the second secondary winding 1442. The drain of the first transistor switch 1428 can be coupled to the gate of the main semiconductor switch 1416. The gate of the first transistor switch 1428 can be coupled to the second end of the second secondary winding 1442 through the third resistor 1430. The second resistor 1432 can act to adjust the turn-off speed of the main semiconductor switch 1416. The third resistor 1430 can act to adjust the turn-on speed of the first transistor switch 1428. The turn ratio of the primary winding 1406 to the first and second secondary windings 1408, 1442 enable the activation path 1412 and deactivation path 1414 to provide asymmetrical voltages.

When a positive voltage pulse is passed through the transformer 1404, the second transistor switch 1422 is opened due to the positive voltage applied between the gate and source of the second transistor switch 1422, thus allowing current to flow through the activation path 1412, which in turn applies a positive voltage across the gate and source of the main semiconductor switch 1416. The positive voltage applied across the gate and source of the main semiconductor switch 1416 is above the threshold voltage of the main semiconductor switch 1416, thus enabling the main semiconductor switch 1416 to allow current to flow from its drain to its source (e.g., turning the main semiconductor switch 1416 on). When the main semiconductor switch 1416 is on, power can be supplied to the switched component 1418.

When a negative voltage pulse is passed through the transformer 1404, the first transistor switch 1428 is opened due to the positive voltage applied between the gate and source of the first transistor switch 1428, thus allowing current to flow through the deactivation path 1414, which in turn applies a negative voltage across the gate and source of the main semiconductor switch 1416. The negative voltage applied across the gate and source of the main semiconductor switch 1416 is sufficiently below the threshold voltage of the main semiconductor switch 1416, thus ensuring the main semiconductor switch 1416 does not allow current to flow from its drain to its source (e.g., turning the main semiconductor switch 1416 off). When the main semiconductor switch 1416 is off, power is not supplied to the switched component 1418.

Figure 15:
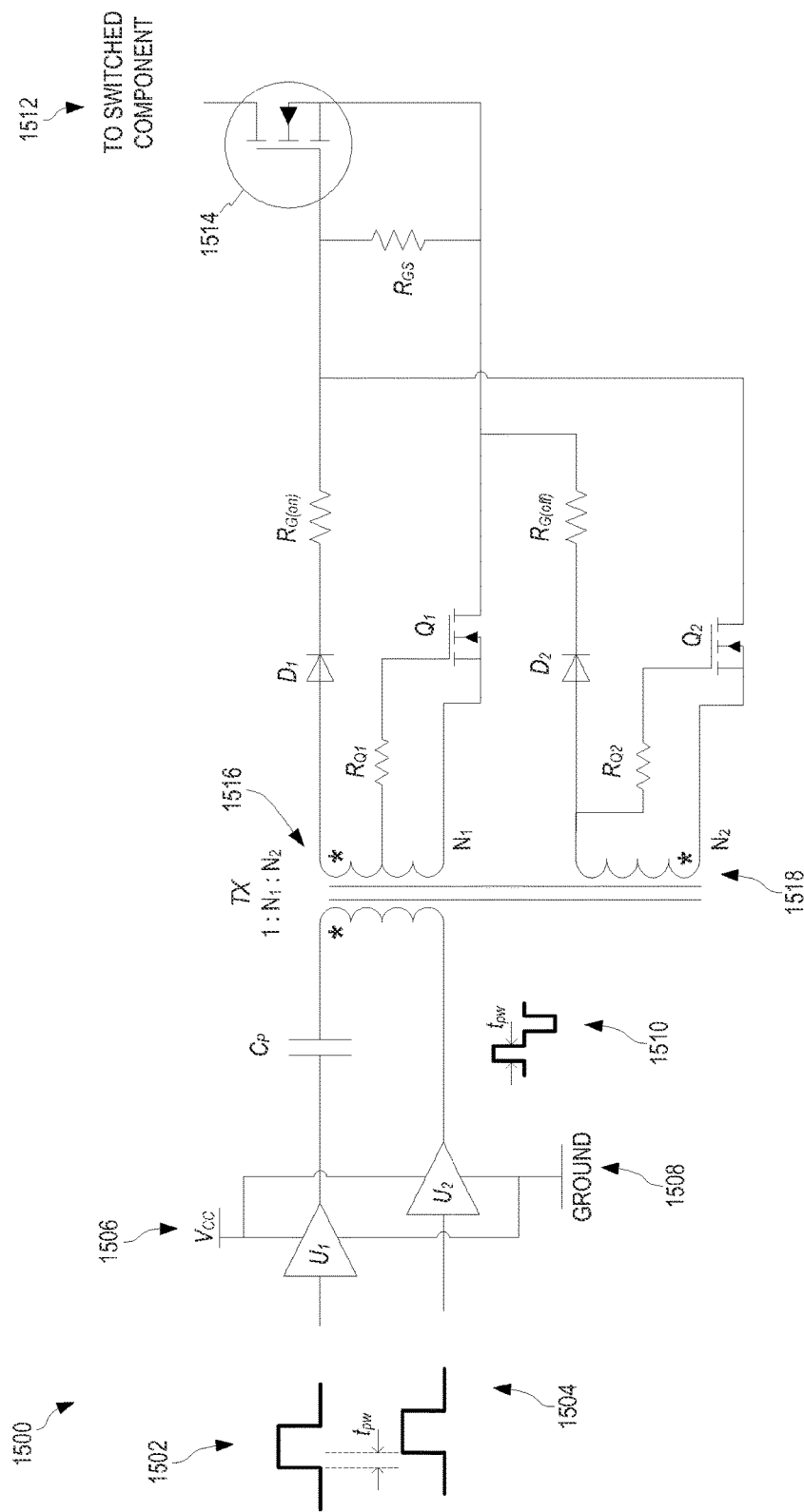
FIG. 15 is a schematic circuit diagram depicting a gate driver having two transistor switches and two secondary windings according to certain aspects of the disclosure.

FIG. 15 is a schematic circuit diagram depicting a gate driver 1500 having two transistor switches $Q_1$, $Q_2$ and first and second secondary windings 1516, 1518 according to certain aspects of the disclosure. The charge and lock circuit can include a first transistor switch ($Q_1$) and a second transistor switch ($Q_2$) which are both field-effect transistors (FETs). The first and second transistor switches can be enhancement-mode Si N-MOSFETs (e.g., made with a p-type substrate), whose gates are connected, respectively, to the second end of the second secondary winding and the center tap of the first secondary winding through their respective gate resistors ($R_{Q1}$ and $R_{Q2}$). The charge and lock circuit can further include first and second diodes ($D_1$ and $D_2$) (e.g., Si Schottky diodes) but not include a Zener diode. Each switching cycle (turn-on and then turn-off) can be divided into four phases, including a turn-on phase, a stay-on phase, a turn-off phase, and a stay-off phase. The turn-on phase occurs in response to a positive voltage pulse being passed to the charge and lock circuit, the stay-on phase occurs in response to a neutral voltage pulse that occurs after the positive voltage pulse, the turn-off phase occurs in response to a negative voltage pulse, and the stay-off phase occurs in response to a neutral voltage pulse that occurs after the negative voltage pulse.

A PWM signal 1502 is provided to a first driver $U_1$ and a delayed PWM signal 1504 is provided to a second driver $U_2$. The delayed PWM signal 1504 can be created by passing the PWM signal 1502 through a signal delay circuit. The signal delay circuit can delay the PWM signal 1502 by a delay time $t_{pw}$ in order to create the delayed PWM signal 1504. The first and second drivers $U_1$, $U_2$ are provided power from a voltage source 1506 and ground 1508. The first driver and second driver $U_1$, $U_2$ are coupled to opposite sides of the primary winding of the transformer TX. The first driver and second driver $U_1$, $U_2$ operate to generate a pulse signal 1510 from the PWM signal 1502. The pulse signal 1510 can have a pulse width that is equal to the delay time $t_{pw}$. The voltage of the pulse signal 1510 can be based on the voltage source 1506. Optionally, a capacitor $C_P$ can be placed in series with the first driver and second driver $U_1$, $U_2$. The capacitor $C_P$ can remove the direct current (DC) component of the pulse signal 1510.

The charge and lock circuit can include an activation path that includes the first secondary winding 1516, a first diode $D_1$, a first resistor $R_{G(on)}$, the main semiconductor switch 1514, the first transistor switch $Q_1$, and a third resistor $R_{Q1}$. The charge and lock circuit can also include a deactivation path that includes the second secondary winding 1518, the second diode $D_2$, the second resistor $R_{G(off)}$, the main semiconductor switch 1514, the second main semiconductor switch $Q_2$, and the fourth resistor $R_{Q2}$. The charge and lock circuit can also include a shunting resistor $R_{GS}$. The main semiconductor switch 1514 can allow or block current flow to a switched component 1512 coupled to the drain of the main semiconductor switch 1514.

If assuming an ideal transformer and neglecting the voltage drops on $Q_1$, $Q_2$, $D_1$, $D_2$, and the other resistors, the main semiconductor switch gate voltage can be estimated by $V_{GS(on)}=V_{CC}*N_1$ for turn-on and $V_{GS(off)}=V_{CC}*N_2$) for turn-off. In an example, to get +20 V/−5 V on the gate of the main semiconductor switch 1514, let $V_{CC}=20$ V, $N_1=1$, and $N_2=\frac{1}{4}$. Because of the center tap, $Q_1$ will receive ±10 V on its gate, while $Q_2$ will receive ±5 V on its gate, both of which are safe voltage for most low-voltage, low-power Si MOSFETs.

$R_{GS}$ is a shunting resistor in the range of 10-20 kΩ which prevents the gate of the main MOSFET from floating when the gate drive circuit is not powered on. Other ranges for the shunting resistor can be used as appropriate.

Figure 16:
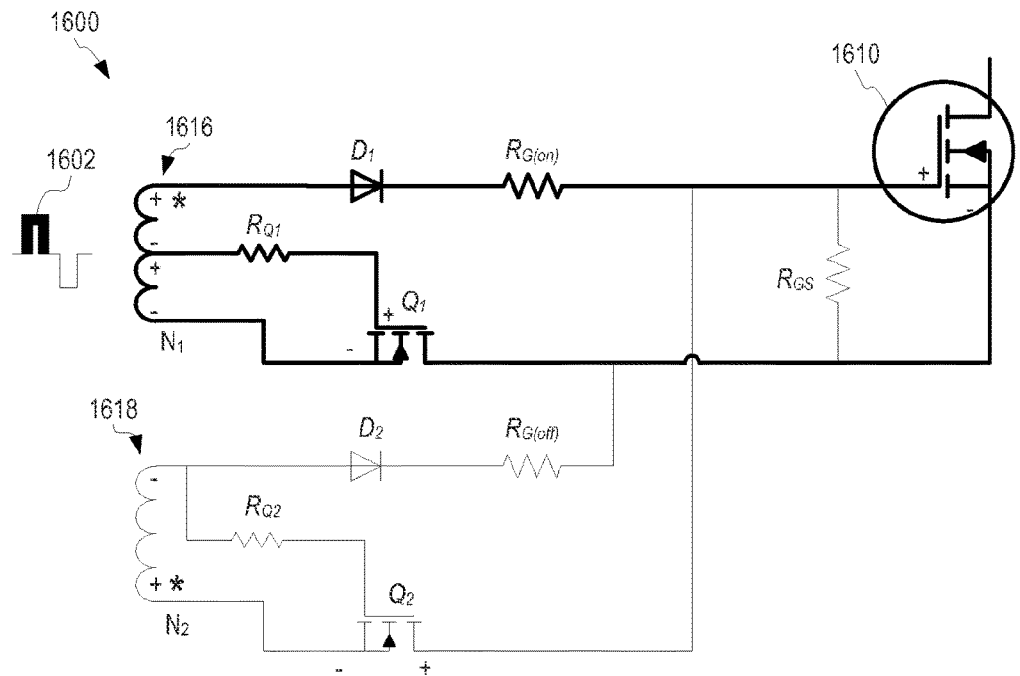
FIG. 16 is a schematic diagram of the charge and lock circuit of FIG. 15 during a turn-on phase according to certain aspects of the disclosure.

FIG. 16 is a schematic diagram of the charge and lock circuit 1600 of FIG. 15 during a turn-on phase according to certain aspects of the disclosure. When a positive voltage pulse 1602 is induced in the first and second secondary windings 1616, 1618, the positive voltage between a second end of the first secondary winding 1616 and the tap can turn on $Q_1$. The turn-on speed of $Q_1$ can be controlled through $R_{Q1}$. $D_1$ can become forward-biased and can start to conduct. Therefore, the gate capacitance of the main semiconductor switch 1610 (e.g., main MOSFET) can be charged by the first secondary winding 1616 through $D_1$, $R_{G(on)}$, and $Q_1$. $R_{G(on)}$ is a resistor used to control the charging current (e.g., an activation current passing through the activation path) and thus the turn-on speed of the main semiconductor switch 1610. The second transistor switch $Q_2$ and the second diode $D_2$ can block current from flowing through the second secondary winding 1618.

Figure 17:
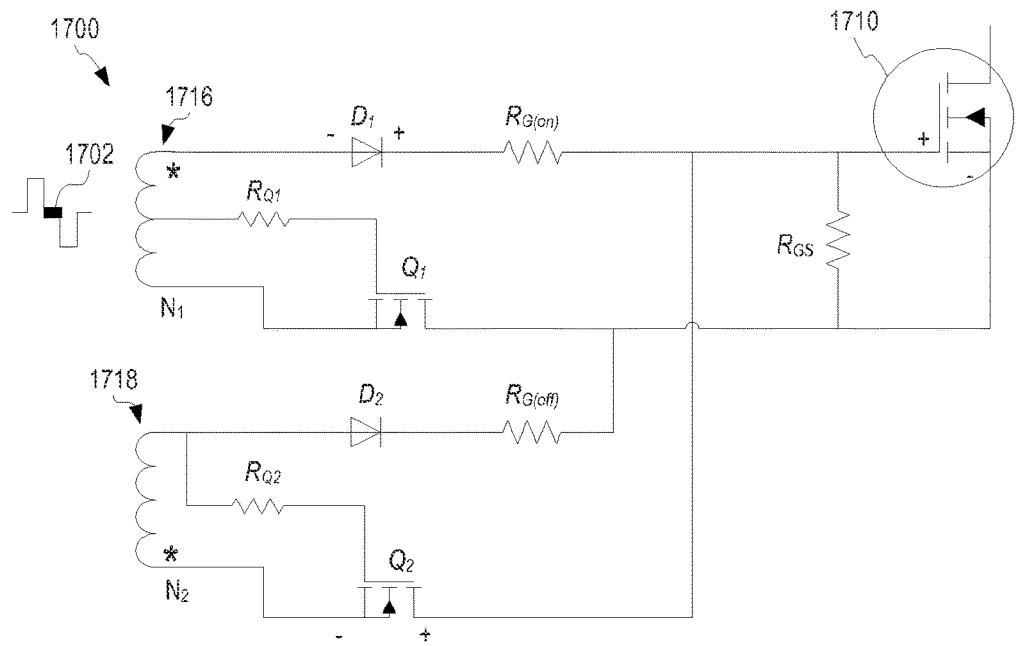
FIG. 17 is a schematic diagram of the charge and lock circuit of FIG. 15 during a stay-on phase according to certain aspects of the disclosure.

FIG. 17 is a schematic diagram of the charge and lock circuit 1700 of FIG. 15 during a stay-on phase according to certain aspects of the disclosure. During the "on" state, a neutral voltage pulse 1702 exists in the pulse signal, resulting in the first and second secondary windings 1716, 1718 being shorted, and thus both $Q_1$ and $Q_2$ are off. $D_1$ and $Q_2$ block the deactivation path of the gate capacitance of the main semiconductor switch 1710, through the first and second secondary windings 1716, 1718, respectively. Therefore, the charge is trapped within the gate of the main semiconductor switch 1710, and the gate voltage $V_{GS}$ Will remain unchanged, in ideal circumstance. In practice, since $D_1$ will change from being forward-biased to blocking $V_{GS}$, and $Q_2$ will need to block higher voltage, their junction capacitances will receive some charge from the main semiconductor switch gate capacitance. Therefore, the actual voltage across the gate and source of the main semiconductor switch $V_{GS}$ will drop slightly at the beginning of this phase.

Figure 18:
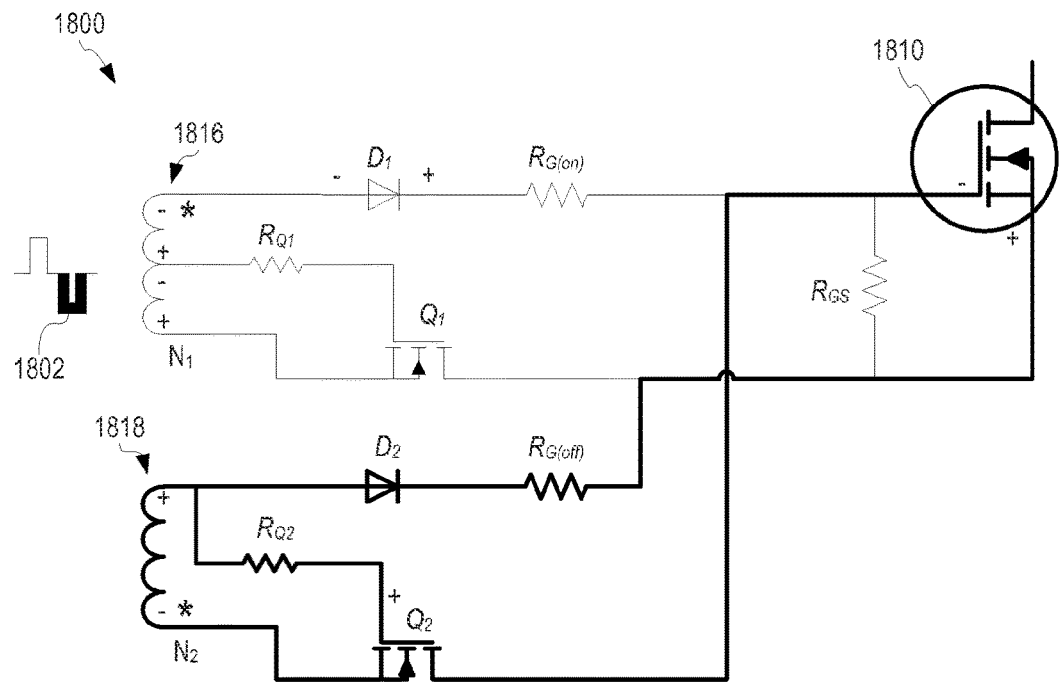
FIG. 18 is a schematic diagram of the charge and lock circuit of FIG. 15 during a turn-off phase according to certain aspects of the disclosure.

FIG. 18 is a schematic diagram of the charge and lock circuit 1800 of FIG. 15 during a turn-off phase according to certain aspects of the disclosure. During the turn-off transient, a negative voltage pulse 1802 is induced in the first and second secondary windings 1816, 1818, which turns on $Q_2$. The turn-on speed of $Q_2$ is controlled through $R_{Q2}$. $D_2$ can become forward-biased and can start to conduct. Therefore, the gate capacitance of the main semiconductor switch is discharged by the second secondary winding 1818 through $D_2$, $R_{G(off)}$, and $Q_2$. $R_{G(off)}$ can be used to control the discharging current (e.g., a deactivation current passing through the deactivation path) and thus the turn-off speed of the main semiconductor switch 1810. Because the number of windings of the second secondary winding 1818 ($N_2$) is different from the number of windings of the first secondary winding 1816 ($N_1$), the $V_{GS}$ during turn-off will be smaller in magnitude than the $V_{GS}$ during turn-on. The first transistor switch $Q_1$ and the first diode $D_1$ can block current from flowing through the first secondary winding 1616.

Figure 19:
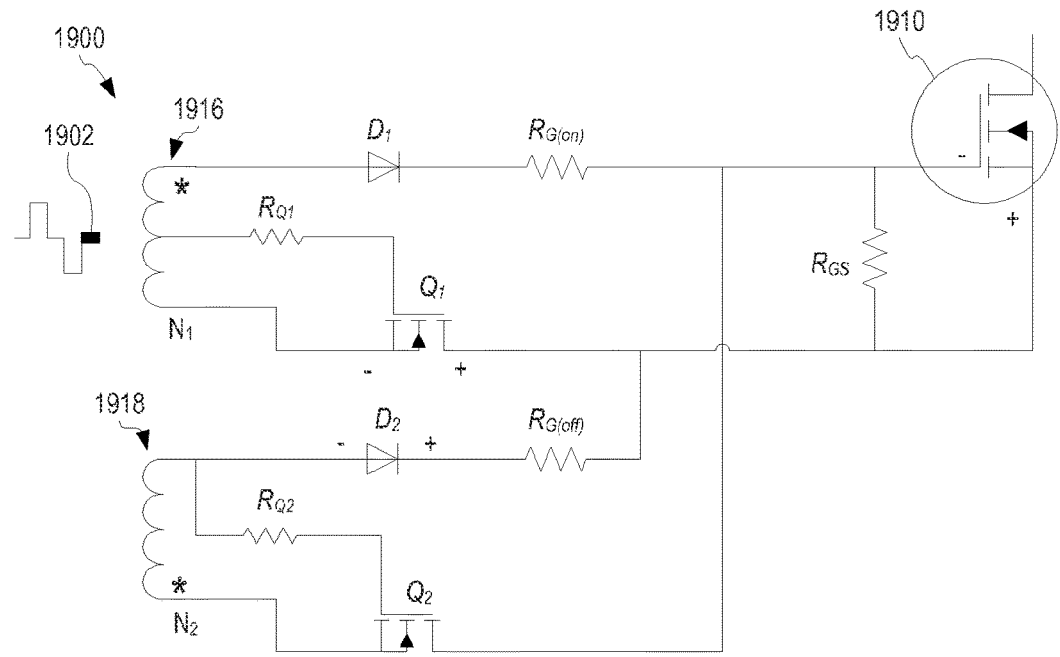
FIG. 19 is a schematic diagram of the charge and lock circuit of FIG. 15 during a stay-off phase according to certain aspects of the disclosure.

FIG. 19 is a schematic diagram of the charge and lock circuit 1900 of FIG. 15 during a stay-off phase according to certain aspects of the disclosure. During the "off" state, a neutral voltage pulse 1902 exists in the pulse signal, resulting in the first and second secondary windings 1916, 1918 being shorted, and thus both $Q_1$ and $Q_2$ are off. $Q_1$ and $D_2$ will block the deactivation path of the gate capacitance of the main semiconductor switch 1910 through the first and second secondary windings 1916, 1918, respectively. Therefore, $V_{GS}$ will remain unchanged in ideal circumstances. In practice, $V_{GS}$ will drop slightly for the same reason as stated above during the "on" state.

Figure 20:
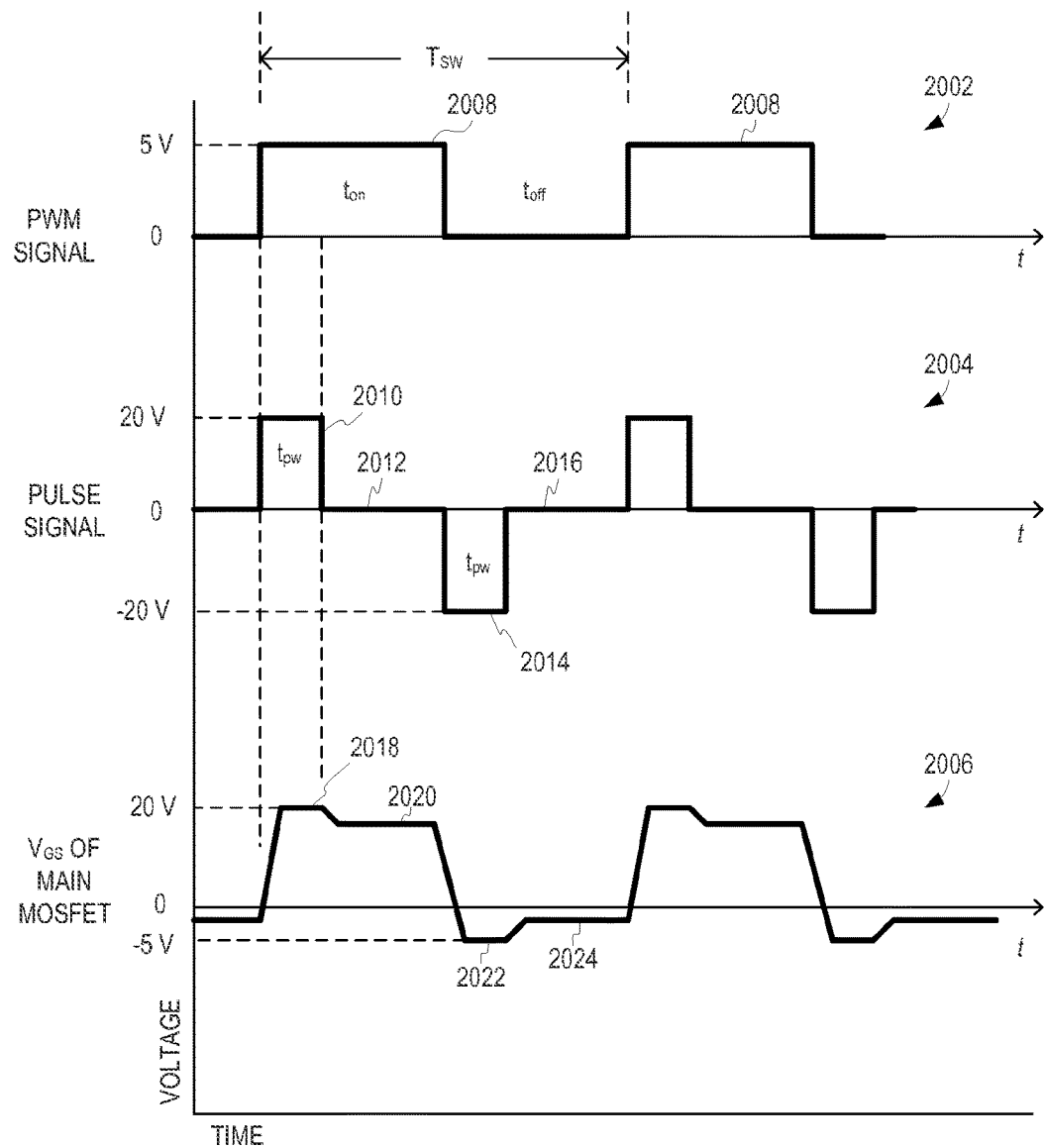
FIG. 20 is a set of time-aligned graphs depicting a pulse-width modulation (PWM) signal, a pulse signal, and a $V_{GS}$ signal according to certain aspects of the disclosure.

FIG. 20 is a set of time-aligned graphs depicting a PWM signal 2002, a pulse signal 2004, and a $V_{GS}$ signal 2006 according to certain aspects of the disclosure. The graphs depicted in FIG. 20 can apply to the various embodiments of the gate drivers described herein, including the embodiments described with reference to FIGS. 2-19.

The PWM signal 2002 is shown as a voltage over time, as provided by a source of a control signal. The PWM signal 2002 can include a series of pulse instances 2008, each having a pulse width ($t_{on}$) and a time before the next pulse instance 2008 ($t_{off}$). The time between pulse instances 2008 (e.g., from the beginning of a first pulse instance 2008 to the beginning of the next pulse instance 2008) can be denoted $T_{SW}$.

The pulse signal 2004 is shown as a voltage over time, as generated by a differential driver circuit, based on the PWM signal 2002. Any DC component of the pulse signal 2004 can be removed using capacitor $C_P$ as described above. At the beginning of each pulse instance 2008 of the PWM signal 2002, the differential driver circuit generates a positive voltage pulse 2010 having a pulse width $t_{pw}$ that is equal to the signal delay introduced in the differential driver circuit, as described above. Following the positive voltage pulse 2010, the pulse signal 2004 can include a stay-on neutral voltage pulse 2012. The duration of the stay-on neutral voltage pulse $t_{(npw,on)}$ is based on the pulse width of the pulse signal 2004 and the pulse width of the PWM signal 2002. The duration of the stay-on neutral voltage pulse 2012 can be calculated as $t_{(npw,on)} = t_{on} - t_{pw}$. Following the stay-on neutral voltage pulse 2012, the pulse signal 2004 includes a negative voltage pulse 2014 that occurs at the end of each pulse instance 2008 of the PWM signal 2002. The negative voltage pulse 2014 has a pulse width $t_{pw}$ that is equivalent to that of the positive voltage pulse 2010. Following the negative voltage pulse 2014, the pulse signal 2004 can include a stay-off neutral voltage pulse 2016. The duration of the stay-off neutral voltage pulse $t_{(npw,off)}$ is based on the pulse width of the pulse signal 2004 and the time before the next pulse instance 2008 of the PWM signal 2002. The duration of the stay-off neutral voltage pulse 2016 can be calculated as $t_{(npw,off)} = t_{off} - t_{pw}$. The magnitude of the pulse signal 2004 is set by the power source powering the differential driver circuit. As shown in FIG. 20, the pulse signal 2004 has a magnitude of 20 volts (e.g., maximum of +20 V and minimum of −20 V).

The voltage provided across the main semiconductor switch (e.g., main mosfet) is denoted as $V_{GS}$. When a positive voltage pulse 2010 is received by the charge and lock circuit, the activation path begins to induce a positive voltage 2018 in the $V_{GS}$ 2006 of the main semiconductor switch. Due to the reasons described above with reference to the activation path, the positive voltage 2018 induced in the $V_{GS}$ can have approximately (e.g., not including small inefficiencies in the circuit) the same magnitude as the pulse signal 2004, here being 20 V. During the stay-on neutral voltage pulse 2012, the $V_{GS}$ of the main semiconductor switch 2006 will settle to a stay-on voltage 2020, generally slightly smaller in magnitude than the positive voltage 2018. When a negative voltage pulse 2014 is received by the charge and lock circuit, the deactivation path begins to induce a negative voltage 2022 in the $V_{GS}$ of the main semiconductor switch 2006. Due to the reasons described above with reference to the deactivation path, the negative voltage 2022 induced in the $V_{GS}$ can have a smaller magnitude than the pulse signal 2004, here having a magnitude of 5 V, shown as a −5 V potential in the $V_{GS}$ of the main semiconductor switch 2006. During the stay-off neutral voltage pulse 2016, the $V_{GS}$ of the main semiconductor switch 2006 will settle to a stay-off voltage 2024, generally slightly smaller in magnitude than the negative voltage 2022.

Figure 21:
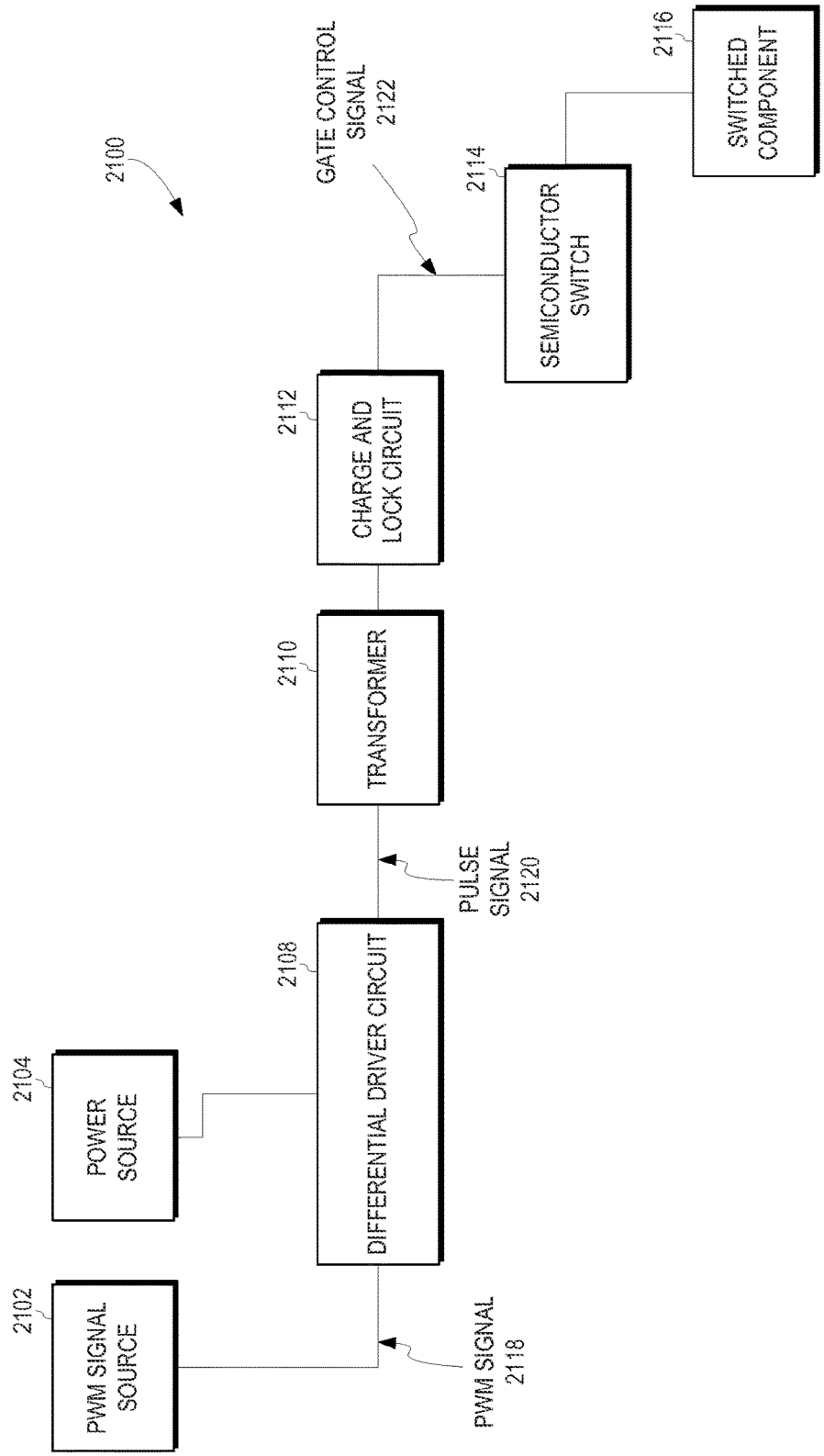
FIG. 21 is a schematic diagram depicting a gate driver according to certain aspects of the disclosure.

FIG. 21 is a schematic diagram depicting a gate driver 2100 according to certain aspects of the disclosure. The gate driver can include a differential driver circuit 2108, a transformer 2110, and a charge and lock circuit 2112 that is couplable to a main semiconductor switch 2114. The differential driver circuit 2108 receives a PWM signal 2118 from a PWM signal source 2102. A power source 2104 supplies power to the differential driver circuit 2108. In some embodiments, the PWM signal source 2102 and power source 2104 can be combined. The differential driver circuit creates a pulse signal 2120 that drives the transformer 2110, which passes the pulse signal 2120 to the charge and lock circuit 2112. The charge and lock circuit 2112 uses the pulse signal 2120, which contains power and control information, to generate a gate control signal 2122 which is applied across the gate and source of the main semiconductor switch 2114. The gate control signal 2122 is a signal that applies either a positive or negative voltage across the gate and source of the main semiconductor switch 2114. The main semiconductor switch 2114 can be coupled to a switched component 2116 to turn on or turn off the switched component, or to provide power to or cease providing power to the switched component 2116. The switched component 2116 can be a component of a downhole tool. The gate driver 2100 can be located in, on, or near a downhole tool in order to operate a component of the downhole tool.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

As used below, any reference to a series of examples is to be understood as a reference to each of those examples disjunctively (e.g., "Examples 1-4" is to be understood as "Examples 1, 2, 3, or 4").

Example 1 is a driver circuit, comprising a transformer having a secondary winding; and a charge and lock circuit couplable to a main semiconductor switch. The charge and lock circuit includes a first diode and a transistor switch in an activation path and coupled to the secondary winding to provide a positive voltage across the main semiconductor switch; and a second diode and a Zener diode in a deactivation path and coupled to the secondary winding to provide a negative voltage across the main semiconductor switch, the negative voltage having a first magnitude that is different than a second magnitude of the positive voltage.

Example 2 is a the driver circuit of example 1, wherein the first diode and the transistor switch are oriented in the activation path to lock the positive voltage across the main semiconductor switch; and wherein the second diode and the Zener diode are oriented in the deactivation path to lock the negative voltage across the main semiconductor switch.

Example 3 is the driver circuit of examples 1 or 2, wherein the charge and lock circuit further includes a shunting resistor coupled between a gate and a source of the main semiconductor switch.

Example 4 is the driver circuit of examples 1-3, wherein the charge and lock circuit further includes a first resistor coupled in series with the transistor switch to control an activation current through the activation path; and a second resistor coupled in series with the Zener diode to control a deactivation current through the deactivation path.

Example 5 is the driver circuit of example 4, wherein the charge and lock circuit further includes a third resistor coupled between a gate of the transistor switch and a center tap of the secondary winding.

Example 6 is the driver circuit of examples 1-5, wherein the charge and lock circuit further includes an additional transistor switch coupled in series between the Zener diode and the secondary winding.

Example 7 is the driver circuit of example 6, wherein a gate of the transistor switch and a gate of the additional transistor switch are both coupled to a center tap of the secondary winding, and wherein a source of the transistor switch and an additional source of the additional transistor switch are coupled to opposite ends of the secondary winding.

Example 8 is the driver circuit of examples 1-7, further comprising a differential driver circuit coupled to a primary winding of the transformer to provide a pulse signal to the primary winding in response to receiving a pulse-width-modulated signal.

Example 9 is the driver circuit of example 8, wherein the differential driver circuit includes a first driver, a second driver, and a signal delay circuit, the first driver couplable to a source of the pulse-width-modulated signal, the second driver couplable to the source through the signal delay circuit, the signal delay circuit having a delay time, wherein the first driver and the second driver are coupled to the primary winding to generate a positive voltage pulse at a beginning of a pulse instance in the pulse-width-modulated signal and a negative voltage pulse at an end of the pulse instance.

Example 10 is a method, comprising delivering, to a charge and lock circuit couplable to a main semiconductor switch, by a secondary winding of a transformer, a pulse signal comprising a positive voltage pulse, a neutral voltage pulse signal, and a negative voltage pulse; providing, by the charge and lock circuit, a positive voltage across a gate and a source of the main semiconductor switch in response to delivery of the positive voltage pulse, wherein the positive voltage is derived from the positive voltage pulse; locking a gate voltage of the main semiconductor switch, by the charge and lock circuit, in response to delivery of the neutral voltage pulse signal; and providing, by the charge and lock circuit, a negative voltage across the gate and the source of the main semiconductor switch in response to delivery of the negative voltage pulse, wherein the negative voltage is derived from passing the negative voltage pulse through a Zener diode to reduce a magnitude of the negative voltage to below a second magnitude of the positive voltage.

Example 11 is the method of example 10, wherein locking the gate voltage includes allowing a potential difference to build between opposite sides of a diode and a transistor switch in the charge and lock circuit.

Example 12 is the method of examples 10 or 11, wherein locking the gate voltage includes allowing a potential difference to build between opposite sides of a second diode and a second transistor switch in the charge and lock circuit.

Example 13 is the method of examples 10-12, wherein providing the positive voltage includes controlling an activation current by passing the positive voltage pulse through a first resistor, and wherein providing the negative voltage includes controlling a deactivation current by passing the negative voltage pulse through a second resistor.

Example 14 is the method of examples 10-13, further comprising generating, by a differential driver circuit, the pulse signal; and delivering the pulse signal to a primary winding of the transformer.

Example 15 is the method of example 14, wherein generating the pulse signal further comprises receiving a pulse-width-modulated signal by a first driver of the differential driver circuit; receiving a delayed pulse-width-modulated signal by a second driver of the differential driver circuit, wherein the delayed pulse-width-modulated signal is obtained by passing the pulse-width-modulated signal through a signal delay circuit; generating the positive voltage pulse at a beginning of a pulse instance in the pulse-width-modulated signal; generating the negative voltage pulse at an end of the pulse instance in the pulse-width-modulated signal; and generating the neutral voltage pulse signal between the positive voltage pulse and the negative voltage pulse.

Example 16 is a system, comprising a control source; a main semiconductor switch; a power source having a first voltage; a differential driver circuit coupled to the control source and the power source to convert a pulse-width-modulated signal from the control source, the pulse-width-modulated signal having a first frequency, into a pulse signal having a second frequency that is equal to the first frequency, a second voltage that is equal to the first voltage, and a constant pulse width; and a charge and lock circuit coupled to the differential driver circuit through a transformer to receive the pulse signal and operate the main semiconductor switch. The charge and lock circuit includes a first diode and a transistor switch in an activation path and coupled to a secondary winding of the transformer to provide a positive voltage across the main semiconductor switch; and a second diode and a Zener diode in a deactivation path and coupled to the secondary winding to provide a negative voltage across the main semiconductor switch, the negative voltage having a first magnitude that is smaller than a second magnitude of the positive voltage.

Example 17 is the system of example 16, wherein the differential driver circuit includes a first driver couplable to the control source and a second driver couplable to the control source through a signal delay circuit, the signal delay circuit having a delay time, wherein the constant pulse width is based on the delay time.

Example 18 is the system of examples 16 or 17, wherein the charge and lock circuit further includes an additional transistor switch coupled in series between the Zener diode and the secondary winding, wherein a gate of the transistor switch and a gate of the additional transistor switch are both coupled to a center tap of the secondary winding, and wherein a source of the transistor switch and an additional source of the additional transistor switch are coupled to opposite ends of the secondary winding.

Example 19 is the system of examples 16-18, wherein the charge and lock circuit further includes a first resistor coupled in series with the transistor switch to control an activation current through the activation path; and a second resistor coupled in series with the Zener diode to control a deactivation current through the deactivation path.

Example 20 is the system of examples 16-19, further comprising a controllable component of a tool positioned in a wellbore, wherein the controllable component is controlled by the main semiconductor switch, and wherein the main semiconductor switch is a power switch.

Example 21 is a driver circuit, comprising a transformer having a first secondary winding and a second secondary winding; and a charge and lock circuit couplable to a main semiconductor switch. The charge and lock circuit includes a first diode and a first transistor switch in an activation path and coupled to the first secondary winding to provide a positive voltage across the main semiconductor switch; and a second diode and a second transistor switch in a deactivation path and coupled to the second secondary winding to provide a negative voltage across the main semiconductor switch, the negative voltage having a first magnitude that is different than a second magnitude of the positive voltage.

Example 22 is the driver circuit of example 21, wherein the first diode and the first transistor switch are oriented in the activation path to lock the positive voltage across the main semiconductor switch; and wherein the second diode and the second transistor switch are oriented in the deactivation path to lock the negative voltage across the main semiconductor switch.

Example 23 is the driver circuit of examples 21 or 22, wherein the charge and lock circuit further includes a shunting resistor coupled between a gate and a source of the main semiconductor switch.

Example 24 is the driver circuit of examples 21-23, wherein the charge and lock circuit further includes a first resistor coupled in series with the first transistor switch to control an activation current through the activation path; and a second resistor coupled in series with the second transistor switch to control a deactivation current through the deactivation path.

Example 25 is the driver circuit of example 24, wherein the charge and lock circuit further includes a third resistor coupled between a gate of the first transistor switch and a center tap of the first secondary winding, wherein a source of the first transistor switch is coupled to a first end of the first secondary winding; and a fourth resistor coupled between a gate of the second transistor switch and a second end of the second secondary winding, wherein a source of the second transistor switch is coupled to a first end of the second secondary winding.

Example 26 is the driver circuit of examples 21-25, wherein a turn ratio for the first secondary winding is larger than the turn ratio for the second secondary winding.

Example 27 is the driver circuit of example 26, wherein the turn ratio for the first secondary winding is between three and five times larger than the turn ratio for the second secondary winding.

Example 28 is the driver circuit of examples 21-27, further comprising a differential driver circuit coupled to a primary winding of the transformer to provide a pulse signal to the primary winding in response to receiving a pulse-width-modulated signal.

Example 29 is the driver circuit of example 28, wherein the differential driver circuit includes a first driver, a second driver, and a signal delay circuit, the first driver couplable to a source of the pulse-width-modulated signal, the second driver couplable to the source through the signal delay circuit, the signal delay circuit having a delay time, wherein the first driver and the second driver are coupled to the primary winding to generate a positive voltage pulse at a beginning of a pulse instance in the pulse-width-modulated signal and a negative voltage pulse at an end of the pulse instance.

Example 30 is a method, comprising delivering, to a charge and lock circuit couplable to a main semiconductor switch, by a transformer, a pulse signal comprising a positive voltage pulse, a neutral voltage pulse signal, and a negative voltage pulse; providing, by the charge and lock circuit, a positive voltage across a gate and a source of the main semiconductor switch in response to delivery of the positive voltage pulse through a first secondary winding of the transformer, wherein the positive voltage is derived from the positive voltage pulse; locking a gate voltage of the main semiconductor switch, by the charge and lock circuit, in response to delivery of the neutral voltage pulse signal; and providing, by the charge and lock circuit, a negative voltage across the gate and the source of the main semiconductor switch in response to delivery of the negative voltage pulse through a second secondary winding of the transformer, wherein a turn ratio for the first secondary winding is larger than a turn ratio for the second secondary winding.

Example 31 is the method of example 30, wherein locking the gate voltage includes allowing a potential difference to build between opposite sides of a diode and a transistor switch in the charge and lock circuit.

Example 32 is the method of examples 30 or 31, wherein locking the gate voltage includes allowing a potential difference to build between opposite sides of a second diode and a second transistor switch in the charge and lock circuit.

Example 33 is the method of examples 30-32, wherein providing the positive voltage includes controlling an activation current by passing the positive voltage pulse through a first resistor, and wherein providing the negative voltage includes controlling a deactivation current by passing the negative voltage pulse through a second resistor.

Example 34 is the method of examples 30-33, further comprising generating, by a differential driver circuit, the pulse signal; and delivering the pulse signal to a primary winding of the transformer.

Example 35 is the method of example 34, wherein generating the pulse signal further comprises receiving a pulse-width-modulated signal by a first driver of the differential driver circuit; receiving a delayed pulse-width-modulated signal by a second driver of the differential driver circuit, wherein the delayed pulse-width-modulated signal is obtained by passing the pulse-width-modulated signal through a signal delay circuit; generating the positive voltage pulse at a beginning of a pulse instance in the pulse-width-modulated signal; generating the negative voltage pulse at an end of the pulse instance in the pulse-width-modulated signal; and generating the neutral voltage pulse signal between the positive voltage pulse and the negative voltage pulse.

Example 36 is a system, comprising a control source; a main semiconductor switch; a power source having a first voltage; a differential driver circuit coupled to the control source and the power source to convert a pulse-width-modulated signal from the control source, the pulse-width-modulated signal having a first frequency, into a pulse signal having a second frequency that is equal to the first frequency, a second voltage that is equal to the first voltage, and a constant pulse width; and a charge and lock circuit coupled to the differential driver circuit through a transformer to receive the pulse signal and operate the main semiconductor switch. The charge and lock circuit includes a first diode and a first transistor switch in an activation path and coupled to a first secondary winding of the transformer to provide a positive voltage across the main semiconductor switch; and a second diode and a second transistor switch in a deactivation path and coupled to a second secondary winding of the transformer to provide a negative voltage across the main semiconductor switch, the negative voltage having a first magnitude that is smaller than a second magnitude of the positive voltage.

Example 37 is the system of example 36, wherein the differential driver circuit includes a first driver couplable to the control source and a second driver couplable to the control source through a signal delay circuit, the signal delay circuit having a delay time, wherein the constant pulse width is based on the delay time.

Example 38 is the system of examples 36 or 37, wherein a turn ratio for the first secondary winding is larger than the turn ratio for the second secondary winding.

Example 39 is the system of examples 36-38, wherein the charge and lock circuit further includes a first resistor coupled in series with the first transistor switch to control an activation current through the activation path; and a second resistor coupled in series with the second transistor switch to control a deactivation current through the deactivation path.

Example 40 is the system of examples 36-39, further comprising a controllable component of a tool positioned in a wellbore, wherein the controllable component is controlled by the main semiconductor switch, and wherein the main semiconductor switch is a power switch.

What is claimed is:
1. A driver circuit, comprising:
a transformer having a first secondary winding and a second secondary winding; and
a charge and lock circuit couplable to a main semiconductor switch, the charge and lock circuit including:
a first diode and a first transistor switch in an activation path and coupled to the first secondary winding to provide a positive voltage across the main semiconductor switch; and
a second diode and a second transistor switch in a deactivation path and coupled to the second secondary winding to provide a negative voltage across the main semiconductor switch, the negative voltage having a first magnitude that is different than a second magnitude of the positive voltage.

2. The driver circuit of claim 1, wherein the first diode and the first transistor switch are oriented in the activation path to lock the positive voltage across the main semiconductor switch; and wherein the second diode and the second transistor switch are oriented in the deactivation path to lock the negative voltage across the main semiconductor switch.

3. The driver circuit of claim 1, wherein the charge and lock circuit further includes a shunting resistor coupled between a gate and a source of the main semiconductor switch.

4. The driver circuit of claim 1, wherein the charge and lock circuit further includes a first resistor coupled in series with the first transistor switch to control an activation current through the activation path; and a second resistor coupled in series with the second transistor switch to control a deactivation current through the deactivation path.

5. The driver circuit of claim 4, wherein the charge and lock circuit further includes:
  a third resistor coupled between a gate of the first transistor switch and a center tap of the first secondary winding, wherein a source of the first transistor switch is coupled to a first end of the first secondary winding; and
  a fourth resistor coupled between a gate of the second transistor switch and a second end of the second secondary winding, wherein a source of the second transistor switch is coupled to a first end of the second secondary winding.

6. The driver circuit of claim 1, wherein a turn ratio for the first secondary winding is larger than the turn ratio for the second secondary winding.

7. The driver circuit of claim 6, wherein the turn ratio for the first secondary winding is between three and five times larger than the turn ratio for the second secondary winding.

8. The driver circuit of claim 1, further comprising:
  a differential driver circuit coupled to a primary winding of the transformer to provide a pulse signal to the primary winding in response to receiving a pulse-width-modulated signal.

9. The driver circuit of claim 8, wherein the differential driver circuit includes a first driver, a second driver, and a signal delay circuit, the first driver couplable to a source of the pulse-width-modulated signal, the second driver couplable to the source through the signal delay circuit, the signal delay circuit having a delay time, wherein the first driver and the second driver are coupled to the primary winding to generate a positive voltage pulse at a beginning of a pulse instance in the pulse-width-modulated signal and a negative voltage pulse at an end of the pulse instance.

10. A method, comprising:
  delivering, to a charge and lock circuit couplable to a main semiconductor switch, by a transformer, a pulse signal comprising a positive voltage pulse, a neutral voltage pulse signal, and a negative voltage pulse;
  providing, by the charge and lock circuit, a positive voltage across a gate and a source of the main semiconductor switch in response to delivery of the positive voltage pulse through a first secondary winding of the transformer, wherein the positive voltage is derived from the positive voltage pulse;
  locking a gate voltage of the main semiconductor switch, by the charge and lock circuit, in response to delivery of the neutral voltage pulse signal; and
  providing, by the charge and lock circuit, a negative voltage across the gate and the source of the main semiconductor switch in response to delivery of the negative voltage pulse through a second secondary winding of the transformer, wherein a turn ratio for the first secondary winding is larger than a turn ratio for the second secondary winding.

11. The method of claim 10, wherein locking the gate voltage includes allowing a potential difference to build between opposite sides of a diode and a transistor switch in the charge and lock circuit.

12. The method of claim 10, wherein locking the gate voltage includes allowing a potential difference to build between opposite sides of a second diode and a second transistor switch in the charge and lock circuit.

13. The method of claim 10, wherein providing the positive voltage includes controlling an activation current by passing the positive voltage pulse through a first resistor, and wherein providing the negative voltage includes controlling a deactivation current by passing the negative voltage pulse through a second resistor.

14. The method of claim 10, further comprising:
  generating, by a differential driver circuit, the pulse signal; and
  delivering the pulse signal to a primary winding of the transformer.

15. The method of claim 14, wherein generating the pulse signal further comprises:
  receiving a pulse-width-modulated signal by a first driver of the differential driver circuit;
  receiving a delayed pulse-width-modulated signal by a second driver of the differential driver circuit, wherein the delayed pulse-width-modulated signal is obtained by passing the pulse-width-modulated signal through a signal delay circuit;
  generating the positive voltage pulse at a beginning of a pulse instance in the pulse-width-modulated signal;
  generating the negative voltage pulse at an end of the pulse instance in the pulse-width-modulated signal; and
  generating the neutral voltage pulse signal between the positive voltage pulse and the negative voltage pulse.

16. A system, comprising:
  a control source;
  a main semiconductor switch;
  a power source having a first voltage;
  a differential driver circuit coupled to the control source and the power source to convert a pulse-width-modulated signal from the control source, the pulse-width-modulated signal having a first frequency, into a pulse signal having a second frequency that is equal to the first frequency, a second voltage that is equal to the first voltage, and a constant pulse width; and
  a charge and lock circuit coupled to the differential driver circuit through a transformer to receive the pulse signal and operate the main semiconductor switch, wherein the charge and lock circuit includes:
    a first diode and a first transistor switch in an activation path and coupled to a first secondary winding of the transformer to provide a positive voltage across the main semiconductor switch; and
    a second diode and a second transistor switch in a deactivation path and coupled to a second secondary winding of the transformer to provide a negative voltage across the main semiconductor switch, the negative voltage having a first magnitude that is smaller than a second magnitude of the positive voltage.

17. The system of claim 16, wherein the differential driver circuit includes a first driver couplable to the control source and a second driver couplable to the control source through a signal delay circuit, the signal delay circuit having a delay time, wherein the constant pulse width is based on the delay time.

18. The system of claim 16, wherein a turn ratio for the first secondary winding is larger than the turn ratio for the second secondary winding.

19. The system of claim 16, wherein the charge and lock circuit further includes a first resistor coupled in series with the first transistor switch to control an activation current through the activation path; and a second resistor coupled in series with the second transistor switch to control a deactivation current through the deactivation path.

20. The system of claim 16, further comprising:
a controllable component of a tool positioned in a wellbore, wherein the controllable component is controlled by the main semiconductor switch, and wherein the main semiconductor switch is a power switch.

* * * * *